United States Patent
Hirano

(10) Patent No.: US 8,759,957 B2
(45) Date of Patent: Jun. 24, 2014

(54) FILM FOR USE IN MANUFACTURING SEMICONDUCTOR DEVICE, METHOD FOR PRODUCING SEMICONDUCTOR DEVICE AND SEMICONDUCTOR DEVICE

(75) Inventor: Takashi Hirano, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 617 days.

(21) Appl. No.: 12/866,108

(22) PCT Filed: Feb. 6, 2009

(86) PCT No.: PCT/JP2009/052075
§ 371 (c)(1), (2), (4) Date: Aug. 4, 2010

(87) PCT Pub. No.: WO2009/099191
PCT Pub. Date: Aug. 13, 2009

(65) Prior Publication Data
US 2011/0006419 A1   Jan. 13, 2011

(30) Foreign Application Priority Data

Feb. 7, 2008  (JP) .................................. 2008-028220
Mar. 28, 2008  (JP) .................................. 2008-085439
Jun. 26, 2008  (JP) .................................. 2008-167547

(51) Int. Cl.
*H01L 23/02*   (2006.01)

(52) U.S. Cl.
USPC ........... 257/678; 257/778; 257/737; 257/686; 257/692; 257/E23.068; 257/E21.499; 438/108

(58) Field of Classification Search
USPC .......... 257/737, E21.499, E23.068, 778, 686, 257/692; 438/108
See application file for complete search history.

(56) References Cited

U.S. PATENT DOCUMENTS 5,136,365 A * 8/1992 Pennisi et al. ................ 257/783
6,791,195 B2   9/2004 Urushima
(Continued)

FOREIGN PATENT DOCUMENTS

JP         7-6982 A     1/1995
JP      2001-181563     7/2001
(Continued)

OTHER PUBLICATIONS

International Search Report for International Application No. PCT/JP2009/052075 mailed May 12, 2009.
(Continued)

*Primary Examiner* — Elias M Ullah
(74) *Attorney, Agent, or Firm* — Smith, Gambrell & Russell LLP

(57) ABSTRACT

A film for use in manufacturing a semiconductor device having at least one semiconductor element of the present invention is characterized by comprising: a base sheet having one surface; and a bonding layer provided on the one surface of the base sheet, the bonding layer being adapted to be bonded to the semiconductor element in the semiconductor device, the bonding layer being formed of a resin composition comprising a crosslinkable resin and a compound having flux activity. Further, it is preferred that in the film of the present invention, the semiconductor element is of a flip-chip type and has a functional surface, and the bonding layer is adapted to be bonded to the functional surface of the semiconductor element.

21 Claims, 4 Drawing Sheets

(56) References Cited

U.S. PATENT DOCUMENTS

| | | | |
|---|---|---|---|
| 7,429,522 B2 | 9/2008 | Matsumura et al. | |
| 8,034,659 B2 | 10/2011 | Nagai et al. | |
| 2002/0001688 A1 | 1/2002 | Ueda et al. | |
| 2002/0017710 A1* | 2/2002 | Kurashima et al. | 257/686 |
| 2002/0132108 A1* | 9/2002 | Ikegawa et al. | 428/323 |
| 2003/0149222 A1* | 8/2003 | Ichinose et al. | 528/170 |
| 2003/0207117 A1 | 11/2003 | Ueda et al. | |
| 2004/0142280 A1* | 7/2004 | Iwanaga et al. | 430/281.1 |
| 2005/0008873 A1 | 1/2005 | Noro et al. | |
| 2005/0139973 A1 | 6/2005 | Matsumura et al. | |
| 2005/0140026 A1* | 6/2005 | Salmon | 257/778 |
| 2005/0158557 A1 | 7/2005 | Noro | |
| 2009/0166897 A1 | 7/2009 | Katsurayama et al. | |
| 2009/0283895 A1* | 11/2009 | Kikuchi et al. | 257/692 |
| 2010/0155964 A1 | 6/2010 | Katsurayama et al. | |

FOREIGN PATENT DOCUMENTS

| | | | |
|---|---|---|---|
| JP | 2001-308140 A | 11/2001 | |
| JP | 2001-332520 | 11/2001 | |
| JP | 2003-142505 A | 5/2003 | |
| JP | 2005-28734 A | 2/2005 | |
| JP | 2005-191322 A | 7/2005 | |
| JP | 2005-206665 A | 8/2005 | |
| JP | 2006-049482 A | 2/2006 | |
| JP | 2006-203000 A | 8/2006 | |
| JP | 2006-245242 | 9/2006 | |
| JP | 2006-245242 A | 9/2006 | |
| JP | 2006-335817 A | 12/2006 | |
| JP | 2007-103954 A | 4/2007 | |
| JP | 2007-116079 A | 5/2007 | |
| JP | 2007-157820 | 6/2007 | |
| JP | 2007-217708 | 8/2007 | |
| JP | 2007/125650 | 11/2007 | |
| TW | 200801151 A | 1/2008 | |
| WO | 97/21243 A1 | 6/1997 | |
| WO | 2007/125650 A1 | 11/2007 | |
| WO | 2007/148724 A1 | 12/2007 | |

OTHER PUBLICATIONS

Supplementary European Search Report for Application No. EP 09 70 8772 dated Apr. 19, 2011.

Japanese Office Action for Application No. 2008-085439 issued May 31, 2012.

Japanese Office Action for Application No. 2008-085439 issued Feb. 4, 2013.

Japanese Office Action for Application No. 2008-167547 issued Jun. 18, 2013.

Preissuance Submission by a third party on Sep. 13, 2013 (in Japanese).

Preissuance Submission by a third party on Sep. 13, 2012 (in Japanese).

Taiwanese Office Action for Taiwan Patent Application No. 098103979, dated Oct. 17, 2013 (In Taiwanese Only).

* cited by examiner

FILM FOR USE IN MANUFACTURING SEMICONDUCTOR DEVICE, METHOD FOR PRODUCING SEMICONDUCTOR DEVICE AND SEMICONDUCTOR DEVICE

TECHNICAL FIELD

The present invention relates to a film for use in manufacturing a semiconductor device, a method for producing a semiconductor device and a semiconductor device.

BACKGROUND ART

According to the recent trend of high functionality of electronic devices and expansion of their use to mobile applications, there is an increasing demand for developing a semiconductor device having high density and high integration. As a result, an IC package having high capacity and high density is developed. In a method for manufacturing the semiconductor device, an adhesive sheet is, first, attached to a semiconductor wafer made of silicon, gallium, arsenic or the like, and then the semiconductor wafer is diced (or segmented) into individual semiconductor elements. Next, the semiconductor elements thus segmented are separated from each other by expanding the adhesive sheet, picked up, and then die-bonded to a metal lead frame, a tape substrate or an organic hard substrate, to thereby obtain the semiconductor device.

Further, there is remarkable technological innovation for a semiconductor device having lightness and compactness. Thus, various package structures for the semiconductor device have been proposed and the semiconductor device having such a structure has been produced. In recent years, in place of such a conventional method for mounting a semiconductor element on a lead frame, an area mounting method, in which a semiconductor element having a circuit surface (functional surface) and a circuit substrate are bonded together through a plurality of protruding electrodes directly formed on the functional surface of the semiconductor element, is becoming a dominant method.

As the typical area mounting method, a flip-chip mounting method is used. In the flip-chip mounting method, generally, a gap between the semiconductor element and the circuit substrate is sealed with a resin composition to reinforce a joint portion through which the semiconductor element and the circuit substrate are bonded together and to improve reliability of a semiconductor device obtained by bonding the semiconductor element and the circuit substrate together.

Further, a method for manufacturing a stacked package by sterically stacking (laminating) a plurality of semiconductor elements together is also becoming a dominant mounting method. In the method for manufacturing a stacked package, since the plurality of semiconductor elements are arranged in a sterical manner rather than in a planar manner, a compact package (semiconductor device) can be manufactured. Further, since such a package contains the plurality of semiconductor elements, it can process a large amount of information, thereby improving overall performance thereof.

As one of techniques for manufacturing a stacked package by sterically stacking a plurality of semiconductor elements, there is a technique called Multi-Chip Package (MCP) in which a plurality of semiconductor elements are sterically stacked and electrically connected together via bonding wires to manufacture the stacked package.

In contrast, as the other technique, there is a technique in which a plurality of semiconductor elements are sterically stacked and electrically connected together via electrodes passing through each semiconductor element in a thickness direction thereof (Through Silicon Via (TSV)). In the TSV technique, through-holes are formed in each semiconductor element in the thickness direction thereof and filled with metal, and then the semiconductor elements are electrically connected together via the metal. According to such a method, since no bonding wires are needed to electrically connect the semiconductor elements, there is a merit that a distance between the semiconductor elements can be shortened. For this reason, the TSV technique will become a dominant technique for sterically stacking a plurality of semiconductor elements.

In this regard, in such a TSV technique, generally, a gap between the semiconductor elements is also sealed with a resin composition to reinforce a joint portion through which the semiconductor elements are bonded together and to improve reliability of a semiconductor device obtained by bonding the semiconductor elements together.

As such a sealing method with the resin composition, a capillary underfill method is generally used. In this method, a sealing resin composition in a liquid state is applied on a circuit substrate along one side or a plurality of sides of a semiconductor element provided on the circuit substrate, and then flowed into a gap between the semiconductor element and the circuit substrate by utilizing capillary phenomenon, to thereby seal the gap with the sealing resin composition (see patent document 1: JP-A-2007-217708).

However, in the capillary underfill method, a step of bonding the semiconductor element and the circuit substrate together using a flux and a step of cleaning (removing) the flux are required. Therefore, the time required for performing the above steps becomes long and environment management such as management of a waste solution after cleaning the flux must be severely carried out. Furthermore, since the sealing of the gap with the sealing resin composition is performed by utilizing the capillary phenomenon, the time required for sealing the gap becomes long. For these reasons, there is a problem in that the use of the capillary underfill method lowers productivity of the semiconductor device.

Further, in recent years, according to a demand for manufacturing a thin semiconductor package, a semiconductor element which has been, in advance, ground is often used in the semiconductor package. Such a ground semiconductor element can be obtained by attaching a backgrinding tape to an element functional surface of a processed semiconductor wafer, grinding a surface opposite to the element functional surface of the semiconductor wafer, removing the backgrinding tape from the semiconductor wafer, attaching a dicing tape to the element functional surface of the semiconductor wafer, and then dicing the semiconductor wafer. Since the ground semiconductor element has to be obtained through the above complicated steps, a more simple method for obtaining it is required. Further, there is a problem in that a thin ground semiconductor wafer is easily damaged when being transferred or handled.

DISCLOSURE OF THE INVENTION

It is an object of the present invention to provide a film for use in manufacturing a semiconductor device which can manufacture the semiconductor device in high productivity without cleaning a flux and improve workability in processing a semiconductor wafer.

Further, it is another object of the present invention to provide a method for manufacturing a semiconductor device in which a semiconductor element and a structural body comprising a substrate are bonded together in high productivity.

Further, it is another object of the present invention to provide a semiconductor device comprising a cured product of a bonding layer of the film above.

Furthermore, it is another object of the present invention to provide a semiconductor device in which a semiconductor element and a structural body comprising a substrate are preferably bonded together.

In order to achieve the objects described above, the present inventions are directed to the following features (1) to (25).

(1) A film for use in manufacturing a semiconductor device having at least one semiconductor element, the film comprising:
a base sheet having one surface; and
a bonding layer provided on the one surface of the base sheet, the bonding layer being adapted to be bonded to the semiconductor element in the semiconductor device, the bonding layer being formed of a resin composition comprising a crosslinkable resin and a compound having flux activity.

(2) The film according to the above feature (1), wherein the semiconductor element has one surface and electrode terminals provided on the one surface thereof, and
wherein the bonding layer is adapted to be bonded to the one surface of the semiconductor element.

(3) The film according to the above feature (1), wherein the semiconductor element is of a flip-chip type and has a functional surface, and
wherein the bonding layer is adapted to be bonded to the functional surface of the semiconductor element.

(4) The film according to the above feature (1), wherein in the case where the bonding layer is heated from room temperature at a temperature raising rate of 10° C./min to bring it into a molten state, the bonding layer in the molten state has such a property that a melt viscosity thereof is initially lowered down to a lowest value, and then is raised, and
wherein the lowest value of the melt viscosity is in the range of 10 to 10,000 Pa·s.

(5) The film according to the above feature (1), further comprising a releasing layer provided between the base sheet and the bonding layer.

(6) The film according to the above feature (1), wherein the bonding layer has such transparency as to allow a surface of the semiconductor element to be observed through the bonding layer in a state that the bonding layer is bonded to the surface of the semiconductor element.

(7) The film according to the above feature (1), wherein the resin composition further comprises a resin having film-forming property.

(8) The film according to the above feature (7), wherein the resin composition further comprises a curing agent.

(9) The film according to the above feature (8), wherein the resin composition further comprises an inorganic filler.

(10) The film according to the above feature (9), wherein an average particle size of particles of the inorganic filler is 0.5 μm or less.

(11) The film according to the above feature (1), wherein the compound having flux activity includes a curing agent having flux activity.

(12) The film according to the above feature (1), wherein the compound having flux activity has at least one functional group selected from the group comprising a carboxyl group and a phenolic hydroxyl group.

(13) The film according to the above feature (1), wherein the film is used for bonding the semiconductor element to a structural body included in the semiconductor device, the structural body comprising a substrate having one surface and other semiconductor element provided on the one surface of the substrate, and
wherein the semiconductor elements are adapted to be bonded together through the bonding layer of the film from which the base sheet has been removed.

(14) A method for manufacturing a semiconductor device, comprising:
preparing a semiconductor wafer having one surface;
bonding the bonding layer of the film according to the above feature (1) to the one surface of the semiconductor wafer;
dicing the semiconductor wafer together with the bonding layer of the film without dicing the base sheet thereof to obtain a plurality of semiconductor elements, each of the semiconductor elements having a diced bonding layer bonded thereto;
picking up each semiconductor element with the diced bonding layer by separating it from the base sheet; and
mounting the semiconductor element with the diced bonding layer on a structural body included in the semiconductor device so that the diced bonding layer makes contact with the structural body to bond the semiconductor element to the structural body through the diced bonding layer thereof.

(15) The method according to the above feature (14), wherein the semiconductor wafer has the other surface opposite to the one surface thereof, and
wherein the method further comprises a grinding step for grinding the other surface of the semiconductor wafer between the bonding step and the dicing step.

(16) The method according to the above feature (15), wherein the structural body comprises a substrate and other semiconductor element than the semiconductor element obtained by dicing the semiconductor wafer, the other semiconductor element being mounted on one surface of the substrate, and
wherein in the mounting step, the semiconductor element is mounted on the opposite side of the other semiconductor element from the substrate through the diced bonding layer.

(17) The method according to the above feature (16), wherein the structural body comprises a cured product formed of a resin composition comprising a crosslinkable resin and a compound having flux activity, wherein the other semiconductor element and the substrate are in advance bonded together through the cured product.

(18) The method according to the above feature (17), wherein the one surface of the semiconductor wafer constitutes a functional surface on which protruding electrodes are in advance formed.

(19) The method according to the above feature (18), wherein the semiconductor wafer has a plurality of conductive portions each passing through the semiconductor wafer in a thickness direction thereof, and
wherein in the dicing step, the semiconductor wafer is diced so that each of the semiconductor elements has at least one of the conductive portions.

(20) A semiconductor device comprising a cured product of the bonding layer of the film according to the above feature (1).

(21) A semiconductor device, comprising:
a substrate having one surface;
a first semiconductor element provided on the one surface of the substrate;
a second semiconductor element provided on the first semiconductor element, the second semiconductor element having a plurality of conductive portions each passing through the second semiconductor element in a thickness direction thereof;
a plurality of protruding electrodes formed on the first semiconductor element through which the first semiconductor element and the second semiconductor element are electrically connected together; and a first joint layer provided between the first semiconductor element and the second semiconductor element, the first joint layer formed of a cured product of a resin composition comprising a crosslinkable resin and a compound having flux activity.

(22) The semiconductor device according to the above feature (21), further comprising a plurality of protruding electrodes formed on the one surface of the substrate through which the substrate and the first semiconductor element are electrically connected together, and a second joint layer provided between the substrate and the first semiconductor element, the second joint layer formed of a cured product of a resin composition comprising a crosslinkable resin and a compound having flux activity.

(23) The semiconductor device according to the above feature (22), wherein the resin composition of each of the first and second joint layers further comprises a resin having film-forming property.

(24) The semiconductor device according to the above feature (23), wherein the compound of the resin composition has at least one functional group selected from the group comprising a carboxyl group and a phenolic hydroxyl group.

(25) The semiconductor device according to the above feature (24), wherein the compound of the resin composition serves as a curing agent for the crosslinkable resin.

BEST MODE FOR CARRYING OUT THE INVENTION

Hereinafter, a film for use in manufacturing a semiconductor device, a method for manufacturing a semiconductor device and a semiconductor device in accordance with the present invention will be described in detail.

The film for use in manufacturing a semiconductor device of the present invention includes a base sheet having one surface and a bonding layer provided on the one surface of the base sheet. The bonding layer is characterized by being formed of a resin composition comprising a crosslinkable resin and a compound having flux activity.

Further, the method for manufacturing a semiconductor device of the present invention is characterized by including a bonding step in which the bonding layer of the film mentioned above is bonded to one surface of a semiconductor wafer; a dicing step in which the semiconductor wafer is diced together with the bonding layer of the film without dicing the base sheet thereof to obtain a plurality of semiconductor elements, each of the semiconductor elements having a diced bonding layer bonded thereto; a picking up step in which each semiconductor element with the diced bonding layer is picked up by separating it from the base sheet; and a mounting step in which the semiconductor element with the diced bonding layer is mounted on a structural body included in the semiconductor device so that the diced bonding layer makes contact with the structural body to bond the semiconductor element to the structural body through the diced bonding layer thereof.

Further more, the semiconductor device of the present invention is characterized by including a cured product of the bonding layer of the film mentioned above.

Moreover, the semiconductor device of the present invention is characterized by including a substrate having one surface; a first semiconductor element provided on the one surface of the substrate; a second semiconductor element provided on the first semiconductor element, the second semiconductor element having a plurality of conductive portions each passing through the second semiconductor element in a thickness direction thereof; a plurality of protruding electrodes formed on the first semiconductor element through which the first semiconductor element and the second semiconductor element are electrically connected together; and a first joint layer provided between the first semiconductor element and the second semiconductor element, the first joint layer formed of a cured product of a resin composition comprising a crosslinkable resin and a compound having flux activity.

(Film for Use in Manufacturing Semiconductor Device)

First, description will be made on the film for use in manufacturing a semiconductor device.

Figure 1:
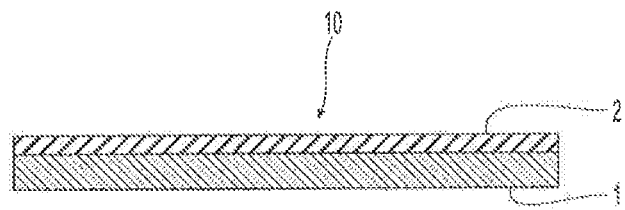
FIG. 1 is a sectional view schematically showing a film for use in manufacturing a semiconductor device of the present invention.

As shown in FIG. 1, the film for use in manufacturing a semiconductor device 10 (hereinbelow, the film for use in manufacturing a semiconductor device 10 is simply referred to as "film 10") comprises a base sheet 1 and a bonding layer 2 provided on an upper surface (one surface) of the base sheet 1. A releasing layer is not showings in the drawings, but may be provided between the base sheet 1 and the bonding layer 2. This makes it possible to easily separate the bonding layer 2 from the base sheet 1. As a result, it is possible to reliably pick up semiconductor elements each obtained by dicing a semiconductor wafer bonded to the film 10.

The bonding layer 2 of the film 10 is formed of a resin composition comprising a crosslinkable resin and a compound having flux activity.

Examples of the crosslinkable resin include: a thermosetting resin such as epoxy resin, oxetane resin, phenol resin, (meth)acrylate resin, unsaturated polyester resin, diallyl phthalate resin, maleimide resin and the like; a thermoplastic resin having a functional group such as an carboxyl group, an epoxy group and the like. Among them, the epoxy resin is preferably used as the crosslinkable resin, because it is superior in curability and storage stability of the bonding layer 2 while the cured product thereof is excellent in heat resistance, moisture resistance and chemical resistance.

As the epoxy resin, it may be possible to use an epoxy resin kept in a solid state at room temperature, an epoxy resin kept in a liquid state at room temperature, or a mixture thereof. By using such an epoxy resin, it becomes possible to increase a degree of freedom in designing melting behavior of the bonding layer 2.

Examples of the epoxy resin kept in a solid state at room temperature include, but are not particularly limited to, a bisphenol type epoxy resin such as bisphenol A type epoxy resin, bisphenol S type epoxy resin and the like, a novolak type epoxy resin such as phenol novolak type epoxy resin, cresol novolak type epoxy resin and the like, a multifunctional epoxy resin such as glycidyl amine type epoxy resin, glycidyl ester type epoxy resin, three functional epoxy resin, four functional epoxy resin and the like. More specifically, it is preferred that the epoxy resin kept in a solid state at room temperature includes a mixture of solid three functional epoxy resin and cresol novolak type epoxy resin. This makes it possible to enhance reliability for moisture resistance of a semiconductor device manufactured as described below.

On the other hand, examples of the epoxy resin kept in a liquid state at room temperature include, but are not particularly limited to, bisphenol A type epoxy resin, bisphenol F type epoxy resin, hydrogenated bisphenol A type epoxy resin, 4-t-butylcatechol type epoxy resin, naphthalene type epoxy resin and the like.

An amount of the crosslinkable resin contained in the resin composition of the bonding layer 2 is not particularly limited to a specific value, but may be preferably in the range of 25 to 75 wt %, and more preferably in the range of 45 to 70 wt %. By setting the amount of the crosslinkable resin in the resin composition to a value within the above-range, it is possible to obtain superior curability of the bonding layer 2 when curing it, and to design good melting behavior of the bonding layer 2.

The compound having flux activity is not particularly limited to a specific type as long as it has an effect of removing metal oxide films by being heated and the like. Examples of the compound having flux activity include an organic acid such as an active rosin, an organic compound having an carboxyl group or the like. The compound having flux activity may be a compound having flux activity in itself or capable of enhancing flux activity such as amine, phenol, alcohol, azine or the like.

More specifically, examples of the compound having flux activity include a compound having one or more of a carboxyl group and/or a phenolic hydroxyl group in a molecule thereof. Such compounds may be in the form of a liquid or a solid.

Examples of the compound having a carboxyl group include an aliphatic acid anhydride, an alicyclic acid anhydride, an aromatic acid anhydride, an aliphatic carboxylic acid, an aromatic carboxylic acid and the like. Further, examples of the compound having a phenolic hydroxyl group include phenols.

Examples of the aliphatic acid anhydride include succinic acid anhydride, polyadipic acid anhydride, polyazelaic acid anhydride, polysebacic acid anhydrate, and the like.

Examples of the alicyclic acid anhydride include methyl tetrahydrophthalic acid anhydride, methyl hexahydrophthalic acid anhydride, methyl himic acid anhydride, hexahydrophthalic acid anhydride, tetrahydrophthalic acid anhydride, trialkyl tetrahydrophthalic acid anhydride, methyl cyclohexene dicarboxylic acid anhydride, and the like.

Examples of the aromatic acid anhydride include phthalic acid anhydride, trimellitic acid anhydride, pyromellitic acid dianhydride, benzophenone tetracarboxylic acid anhydrate, ethylene glycol bistrimellitate, glycerol tristrimellitate, and the like.

Examples of the aliphatic carboxylic acid include a compound represented by the following formula (1).

$$HOOC-(CH_2)_n-COOH \qquad (1)$$

[wherein in the above formula, "n" is an integer of 0 to 20.]

In the compound represented by the above formula (1), in order to keep a balance between a flux activity thereof, an amount of outgases which would be generated from the bonding layer 2 when being bonded to an object (e.g., a semiconductor wafer described below) and an elastic modulus or glass transition temperature of a cured product of the bonding layer 2 (e.g., a first joint layer 122 described below), "n" in the above formula (1) is not particularly limited to a specific value, but may be preferably in the range of 3 to 10, and more preferably in the range of 4 to 8. By setting "n" in the above formula (1) to a value equal to or higher than the lower limit value noted above, it is possible to suppress an increase in the elastic module of the cured product of the bonding layer 2 so that adhesion between the cured product of the bonding layer 2 and the object is improved. Further, by setting "n" in the above formula (1) to a value equal to or lower than the upper limit value noted above, it is possible to suppress an decrease in the elastic module of the cured product of the bonding layer 2 so that connection reliability of a semiconductor device obtained using the film 10 is increased.

Examples of the compound represented by the above formula (1) and having "n" of 3 to 10 include glutaric acid ("n"=3: $HOOC-(CH_2)_3-COOH$), adipic acid ("n"=4: $HOOC-(CH_2)_4-COOH$), pimelic acid ("n"=5: $HOOC-(CH_2)_5-COOH$), sebacic acid ("n"=8: $HOOC-(CH_2)_8-COOH$), $HOOC-(CH_2)_{10}-COOH$ ("n"=10), and the like.

Examples of the other aliphatic carboxylic acid than the compound represented by the above formula (1) include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid, and the like.

Examples of the aromatic carboxylic acid include benzoic acid, phthalic acid, isophthalic acid, terephthalic acid, hemimellitic acid, trimellitic acid, trimesic acid, mellophanic acid, prehnitic acid, pyromellitic acid, mellitic acid, triilic acid, xylic acid, hemelitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid, phenol phthalin, diphenolic acid, and the like.

As described above, examples of the compound having a phenolic hydroxyl group include phenols. Specifically, examples of the phenols include monomers each having a phenolic hydroxyl group such as phenol, o-cresol, 2,6-xylenol, p-cresol, m-cresol, o-ethyl phenol, 2,4-xylenol, 2,5-xylenol, m-ethyl phenol, 2,3-xylenol, meditol, 3,5-xylenol, p-tertiarybutyl phenol, catechol, p-tertiaryamyl phenol, resorcinol, p-octyl phenol, p-phenyl phenol, bisphenol A, bisphenol F, bisphenol AF, biphenol, diallyl bisphenol F, diallyl bisphenol A, trisphenol, tetrakisphenol and the like, phenol novolak resin, o-cresol novolak resin, bisphenol F novolak resin, bisphenol A novolak resin and the like.

Further, it is preferred that the compound having flux activity includes a curing agent having flux activity which produces a three-dimensional chemical structure by reacting with the crosslinkable resin such as epoxy resin or the like and is introduced into the three-dimensional chemical structure.

This makes it possible to omit a step of cleaning the compound having flux activity after it exhibits its flux activity, and to further improve connection reliability of a semiconductor device obtained using the film 10.

Examples of the curing agent having flux activity include a compound containing, in one molecule thereof, an aromatic ring capable of exhibiting a flux action with respect to a metal oxide film, at least two phenolic hydroxyl groups which can be bonded to the crosslinkable resin such as the epoxy resin and at least one carboxyl group which is directly bonded to the aromatic ring.

More specifically, examples of the curing agent having flux activity include: benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid) and the like; naphthoic acid derivatives such as 1,4-dihydroxy-2-naphthoic acid, 3,5-dihydroxy-2-naphthoic acid, 3,7-dihydroxy-2-naphthoic acid and the like; phenol phthalin; diphenolic acid; and the like, one or more of which may be used independently or in combination.

Further, an amount of the compound having flux activity contained in the resin composition of the bonding layer 2 is not particularly limited to a specific value, but may be preferably in the range of 1 to 30 wt %, and more preferably in the range of 5 to 25 wt %. If the amount is smaller than the lower limit value noted above, it is sometimes the case that the effect of flux activity of the compound having flux activity becomes insufficient. Even if the amount is set to exceed the upper limit value noted above, it is sometimes the case that the compound having flux activity remains unreacted with the crosslinkable resin in the resin composition of the bonding layer 2, thereby causing occurrence of migration in the cured product of the bonding layer 2 (e.g., a first joint layer 122 described below). Further, if the amount falls within the above range, since surface oxide films formed on electrical connections (copper foils) can be reduced by the compound having flux activity and removed reliably in the curing process of the bonding layer 2, it is possible to bond the electrical connections together in high mechanical strength.

The resin composition may include a curing agent in addition to the compound having flux activity such as the curing agent having flux activity.

Examples of the curing agent include, but are not particularly limited to, phenols, amines, and thiols. Among them, it is preferable to use the phenols in the case where the epoxy resin is used as the crosslinkable resin. This makes it possible for the curing agent to exhibit good reactivity with the epoxy resin in the bonding layer 2. Furthermore, this makes it possible to prevent a size of the bonding layer 2 from being reduced during the curing process thereof and to impart well-suited physical properties (e.g., thermal resistance and moisture resistance) to the bonding layer 2 after the curing process thereof.

Although the phenols are not particularly limited to specific types, in view of physical property of the cured product of the bonding layer 2 (e.g., a first joint layer 122 described below), it is preferred that a phenol compound has two or more functional groups. Examples of such phenols include bisphenol A, tetramethyl bisphenol A, diallyl bisphenol A, biphenol, bisphenol F, diallyl bisphenol F, trisphenol, tetrakisphenol, phenol novolaks, cresol novolaks and the like. Among them, the phenol novolaks and the cresol novolaks are preferably used. This makes it possible to preferably adjust a melt viscosity of the bonding layer 2. Further, in the case where the epoxy resin is used as the crosslinkable resin, it is possible for the curing agent to exhibit good reactivity with the epoxy resin in the bonding layer 2, to thereby improve physical properties of the cured product of the bonding layer 2.

In the case where the phenol novolaks are used as the curing agent, an amount of the curing agent contained in the resin composition of the bonding layer 2 is not limited to a specific value, but from the viewpoint of completely curing of the crosslinkable resin, may be preferably 5 wt % or more, and more preferably 10 wt % or more. Further, in the case where a phenol novolak unreacted with the crosslinkable resin such as the epoxy resin remains in the cured product of the bonding layer 2, it causes occurrence of migration therein. Therefore, in order not to leave the unreacted phenol novolak compound, the amount of the curing agent is preferably 30 wt % or less, and more preferably 25 wt % or less.

In this regard, it is to be noted that in the case where the epoxy resin is used as the crosslinkable resin, the amount of the phenol novolaks contained in the resin composition of the bonding layer 2 may be defined by an equivalent ratio to the epoxy resin. More specifically, the equivalent ratio of the phenol novolaks to the epoxy resin is preferably in the range of about 0.5 to 1.2, more preferably in the range of about 0.6 to 1.1, and even more preferably in the range of about 0.7 to 0.98. By setting the amount to a value equal to or higher than the lower limit value noted above, it is possible to ensure heat resistance and moisture resistance of the cured product of the bonding layer 2. Further, by setting the amount to a value equal to or lower than the upper limit value noted above, it is possible to decrease the amount of the phenol novolak compound unreacted with the epoxy resin in the cured product of the bonding layer 2, to thereby obtain superior anti-migration property thereof.

Further, examples of the curing agent may include an imidazole compound, a phosphorus compound and the like.

In the case where the imidazole compound is used as the curing agent, it is preferred to use an imidazole compound having a melting point of 150° C. or more. This makes it easy to ensure a function causing the bonding layer 2 to happen to be cured (curability of the bonding layer 2) and flux action of the bonding layer 2. In this regard, if the melting point of the imidazole compound is too low, it is sometimes the case that the bonding layer 2 is cured before oxide films of electrical connections (solder bumps) are removed and the electrical connections (solder bumps and electrodes) are metallically bonded together. This produces unstable connection between the electrical connections. Further, if the melting point of the imidazole compound is too low, it is sometimes the case that storage stability of the bonding layer 2 (film 10) is reduced.

Examples of the imidazole compound having a melting point of 150° C. or more include 2-phenyl hydroxyimidazole, 2-phenyl-4-methyl hydroxyimidazole, 2-phenyl-4-methyl imidazole and the like. In this regard, it is to be noted that an upper limit of the melting point of the imidazole compound is not particularly limited to a specific value, but may be appropriately set depending on a bonding temperature of the bonding layer 2.

In the case where such an imidazole compound is used as the curing agent, an amount of the curing agent contained in the resin composition of the bonding layer 2 is particularly limited to a specific value, but may be preferably in the range of 0.005 to 10 wt %, and more preferably in the range of about 0.01 to 5 wt %. By setting the amount to a value equal to or higher than the lower limit value noted above, it is possible for the curing agent to effectively perform its function as a catalyst for curing the crosslinkable resin so that the curability of the bonding layer 2 is improved. Further, by setting the amount to a value equal to or lower than the upper limit value noted above, it is possible to prevent a melt viscosity of the bonding layer 2 from being unduly increased at a melting temperature of a solder. This makes it possible to obtain a good solder junction structure. Further, this makes it possible to effectively improve storage stability of the bonding layer 2.

Examples of the phosphorus compound include: triphenylphosphine; a molecular compound of tetra substituted phosphonium and a multifunctional phenolic compound; a molecular compound of tetra substituted phosphonium, a proton donor and a trialkoxysilane compound; and the like. Among them, from the viewpoint of rapid curability of the bonding layer 2, corrosion resistance property for electrical connections (aluminum pads) of a semiconductor element to which the bonding layer 2 is to be bonded, and superior storage stability of the bonding layer 2, it is preferable to use the molecular compound of the tetra substituted phosphonium and the multifunctional phenolic compound and the molecular compound of the tetra substituted phosphonium, the proton donor and the trialkoxysilane compound.

The resin composition may include a resin having film-forming property other than the crosslinkable resin as described above.

Examples of the resin having film-forming property include phenoxy resin, polyester resin, polyurethane resin, polyimide resin, cyclohexane-modified polyimide resin, polybutadiene, polypropylene, styrene copolymers such as styrene-butadiene-styrene copolymer, styrene-ethylene-butylene-styrene copolymer and the like, polyacetal resin, polyvinyl butyral resin, polyvinyl acetal resin, butyl rubber, chloroprene rubber, polyamide resin, acrylonitrile-butadiene copolymer, acrylonitrile-butadiene-acrylic acid copolymer, acrylonitrile-butadiene-styrene copolymer, polyvinyl acetate, nylon, acrylic rubber and the like, one or more of which may be used independently or in combination.

In the case where the phenoxy resin is used as the resin having film-forming property, a number average molecular weight thereof is preferably in the range of about 5,000 to 15,000. Use of the phenoxy resin having such a number average molecular weight makes it possible to reduce flowability of the bonding layer 2 before being cured, and to keep the thickness of the bonding layer 2 uniform. Examples of a chemical structure of the phenoxy resin include, but are not particularly limited to, a bisphenol A type chemical structure, a bisphenol F type chemical structure and a biphenyl type chemical structure. Among them, it is preferable to use a phenoxy resin having a saturated absorption rate of 1% or less. This makes it possible to suppress occurrence of foaming or peeling attributable to the bonding layer 2, even though the film 10 is bonded to a semiconductor wafer or the film 10 is exposed to a high temperature condition when mounting a semiconductor element on a substrate using a solder.

Further, in order to improve adhesion (bonding property) of the bonding layer 2 to an object, and to enhance compatibility with a resin component other than the resin having film-forming property, a resin having a functional group such as a nitrile group, an epoxy group, a hydroxyl group or a carboxyl group may be used as the resin having film-forming property. As such a resin having a functional group described above, acrylic rubber may be used.

In the case where the acrylic rubber is used as the resin having film-forming property, it is possible to improve film formation property of the bonding layer 2 when the bonding layer 2 is formed into a film. Further, this makes it possible to (appropriately) decrease elastic module of the cured product of the bonding layer 2 so that residual stress between an object and the cured product of the bonding layer 2 can be reduced. As a result, the adhesion (bonding strength) therebetween can be improved.

Further, it is preferred that the acrylic rubber used as the resin having film-forming property is (meth)acrylic acid ester copolymer having a monomer unit including a functional group such as an epoxy group, a hydroxyl group, a carboxyl group or a nitrile group. This makes it possible to improve the adhesion of the bonding layer 2 to a rear surface of a semiconductor element (a surface opposite to a functional surface of the semiconductor element) and the adhesion of the bonding layer 2 to an object such as a coating material provided on the semiconductor element. Examples of monomers used as a constituent of the (meth)acrylic acid ester copolymer include glycidyl (meth)acrylate including a glycidyl group, (meth)acrylate including a hydroxyl group, (meth)acrylate including a carboxyl group, (meth)acrylonitrile including a nitrile group and the like.

Among them, (meth)acrylic acid ester copolymer having a monomer unit including a glycidyl group or a carboxyl group is preferably used as the resin having film-forming property. This makes it possible to promote the curing of the bonding layer 2 (resin composition constituting the bonding layer 2) so that the adhesion of the bonding layer 2 to the object is further improved.

In the case where (meth)acrylic acid ester copolymer having a monomer unit including a carboxyl group is used as the resin having film-forming property, an amount of the monomers including a carboxyl group in the (meth)acrylic acid ester copolymer is not particularly limited to a specific value, but from the viewpoint of further improving the adhesion of the bonding layer 2 to the object, may be preferably 0.5 wt % or more, and more preferably 1 wt % or more. Further, the amount of the monomers including a carboxyl group in the (meth)acrylic acid ester copolymer, from the viewpoint of further improving storage stability of the bonding layer 2, may be preferably 10 wt % or less, and more preferably 5 wt % or less.

A weight average molecular weight of the (meth)acrylic acid ester copolymer is not particularly limited to a specific value, but may be preferably in the range of 1,000 to 1,000,000, and more preferably in the range of 3,000 to 900,000. By setting the weight average molecular weight of the (meth)acrylic acid ester copolymer to fall within the above range, it is possible to further improve film formation property of the resin composition of the bonding layer 2 and to keep flowability of the bonding layer 2 when the film 10 is bonded to the object.

The weight average molecular weight of the (meth)acrylic acid ester copolymer can be measured, for example, using a gel permeation chromatography (GPC). The gel permeation chromatography is carried out, for example, using a high speed GPC apparatus ("SC-8020", produced by Tosoh Corporation) and a column ("TSK-GEL GMHXL-L", produced by Tosoh Corporation) under a measuring condition in which a temperature is 40° C. and a solvent is tetrahydrofuran.

A glass transition temperature of the (meth)acrylic acid ester copolymer may be, from the viewpoint of suppressing adherence of the bonding layer 2 to become too great to thereby improve workability for processing a semiconductor wafer, for example, 0° C. or more, preferably 5° C. or more. Further, the glass transition temperature of the (meth)acrylic acid ester copolymer may be, from the viewpoint of improving low temperature adhesion of the bonding layer 2 to an object, for example, 30° C. or less, preferably 20° C. or less.

The glass transition temperature of the (meth)acrylic acid ester copolymer is measured, for example, by pulling a film formed of the (meth)acrylic acid ester copolymer under constant load (10 mN) using a thermomechanical analyzer ("TMA/SS6100", produced by Seiko Instruments Inc.) while rising a temperature at a heating rate of 5° C./min from −65° C., and the glass transition temperature can be determined based on a value in an inflection point of the tensile strength of the thermomechanical analyzer.

An amount of the resin having film-forming property contained in the resin composition of the bonding layer 2 is not particularly limited to a specific value, but may be preferably in the range of to 50 wt %. By setting the amount of the resin having film-forming property to fall within such a range, it is possible to suppress an increase in an elastic modulus of the cured product of the bonding layer 2 while suppressing a decrease in a film formation property of the bonding layer 2. This makes it possible to further improve the adhesion of the bonding layer 2 to an object, and to suppress an increase in a melt viscosity of the bonding layer 2.

Further, in the case where improvement of property such as heat resistance, dimensional accuracy, and moisture resistance of the cured product of the bonding layer 2 is especially required, the resin composition may include an inorganic filler. Examples of such an inorganic filler include: silicate such as talc, sintered clay, non-sintered clay, mica, and glass; powder of oxide such as titanium oxide, alumina, and fused silica (fused spherical silica and fused-crushed silica), and crystal silica; carbonate such as calcium carbonate, magnesium carbonate, and hydrotalcite; hydroxide such as aluminum hydroxide, magnesium hydroxide, and calcium hydroxide; sulfate or sulfite such as barium sulfate, calcium sulfate, and calcium sulfite; borate such as zinc borate, barium metaborate, aluminum borate, calcium borate, and sodium borate; nitride such as aluminum nitride, boron nitride, and silicon nitride; and the like. These inorganic fillers may be used singly or in combination of two or more of them. Among these fillers, silica powder such as the fused silica and the crystal silica is preferable, and more preferably the fused spherical silica.

In the case where the inorganic filler is contained in the resin composition of the bonding layer 2, it is possible to improve heat resistance, moisture resistance, and mechanical strength of the cured product of the bonding layer 2, and to improve peeling property of the bonding layer 2 from the base sheet 1. Further, a shape of the inorganic filler is not particularly limited to, but may be preferably formed into a spherical shape. This makes it possible to provide the resin composition used as a preferable constituent of the bonding layer 2 having no anisotropic property.

Further, an average particle size of particles of the inorganic filler is not particularly limited to a specific value, but may be preferably 0.5 μm or less, more preferably in the range of 0.01 to 0.5 μm, and even more preferably in the range of 0.01 to 0.3 μm. If the average particle size of the particles of the inorganic filler is smaller than the lower limit value noted above, it is sometimes the case that the mechanical strength of the cured product of the bonding layer 2 is reduced because aggregation of the particles of the inorganic filler occurs. On the other hand, if the average particle size of the particles of the inorganic filler exceeds the upper limit value noted above, transparency of the bonding layer 2 is reduced so that it is difficult to observe an alignment mark provided on one surface of a semiconductor element in a state that the bonding layer 2 is bonded to the one surface of the semiconductor element. As a result, it becomes difficult to perform alignment between the semiconductor element and a substrate.

An amount of the inorganic filler contained in the resin composition of the bonding layer 2 is not particularly limited to a specific value, but may be preferably in the range of 10 to 60 wt %, and more preferably in the range of 20 to 50 wt %. If the amount of the inorganic filler contained in the resin composition is smaller than the lower limit value noted above, it is sometimes the case that the effect of improving the heat resistance, the moisture resistance, and mechanical strength of the cured product of the bonding layer 2 is reduced. On the other hand, If the amount of the inorganic filler contained in the resin composition exceeds the upper limit value noted above, it is sometimes the case that the transparency of the bonding layer 2 is reduced, and tackiness of the bonding layer 2 is reduced.

Further, the resin composition may include a silane coupling agent. In the case where the silane coupling agent is contained in the resin composition of the bonding layer 2, it is possible to further improve the adhesion of the bonding layer 2 to an object. Examples of the silane coupling agent include an epoxy silane coupling agent, an aromatic-containing amino silane coupling agent and the like, one or more of which can be used independently or in combination. An amount of the silane coupling agent contained in the resin composition is not particularly limited to a specific value, but may be preferably in the range of about 0.01 to 5 wt %.

Further, the resin composition may include additional components other than the above components. Examples of the additional components include various kinds of additives for improving different properties such as compatibility between various kinds of resins contained in the resin composition, stability of the resin composition and the bonding layer 2 and workability in forming into a film of the resin composition and the like.

The base sheet 1 comprises a support base and an adhesive layer provided on the support base, wherein the adhesive layer is adhered to the bonding layer 2. Examples of the support base include resin films such as a resin film being excellent in heat resistance or chemical resistance, a cross-linked resin film being formed by crosslinking a constituent resin of the resin film and a peeling-treated film obtained by applying a silicon resin or the like on a surface of the resin film.

Examples of a constituent resin of the resin film include polyolefin such as polyethylene, polypropylene, polybutene and polybutadiene, polyvinyl chloride, ethylene-methacrylic acid copolymer, ethylene-vinyl acetate copolymer, polyester, polyimide, polyethylene terephthalate, polyamide, polyurethane and the like.

A thickness of the base sheet 1 is not particularly limited to a specific value, but may be preferably in the range of 3 to 500 μm, more preferably in the range of 3 to 100 μm, and even more preferably in the range of 10 to 75 μm.

On the other hand, a thickness of the bonding layer 2 is not particularly limited to a specific value, but may be preferably in the range of 3 to 100 μm, and more preferably in the range of 10 to 75 μm.

If the thickness of each of the base sheet 1 and the bonding layer 2 is smaller than the lower limit value noted above, it is sometimes the case that properties of the film 10 is reduced. On the other hand, if the thickness of each of the base sheet 1 and the bonding layer 2 exceeds the upper limit value noted above, this makes it difficult to manufacture a semiconductor device using the film 10. As a result, it is sometimes the case that a degree of thickness accuracy of the semiconductor device manufactured is reduced.

Next, description will be briefly made on a method for producing the film 10.

First, the bonding layer 2 can be formed by applying a liquid material, which is prepared by mixing the resin composition including at least the crosslinkable resin and the compound having flux activity, on a peeling base 21 such as a polyester sheet, and then drying the liquid material at a predetermined temperature. By half cutting only the bonding layer 2 formed on the peeling base 21, the bonding layer 2 can be cut into the same shape as that of a semiconductor wafer, for example, a circular shape. In this case, a bonding film comprising the bonding layer 2 and the peeling base 21 can be obtained as shown in FIG. 2.

Figure 1A:
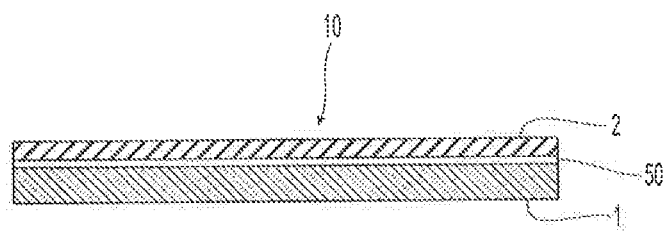
FIG. 1A is a view similar to FIG. 1 of an alternative film including a releasing layer.

Further, in the case of FIG. 1A where the film 10 includes the releasing layer 50 provided between the base sheet 1 and the bonding layer 2, the bonding layer 2 can be formed by applying a liquid material, which is prepared by mixing the resin composition including at least the crosslinkable resin and the compound having flux activity, on the releasing layer formed from a polyethylene terephthalate film and the like, and then drying the liquid material at a predetermined temperature. Further, by half cutting the bonding layer 2 together with the releasing layer after laminating the peeling base 21 on the bonding layer 2, the releasing layer and the bonding layer 2 can be cut into the same shape as that of a semiconductor wafer, for example, a circular shape. In this case, a bonding film comprising the releasing layer 50, the bonding layer 2 and the peeling base 21 can be obtained.

Figure 2:
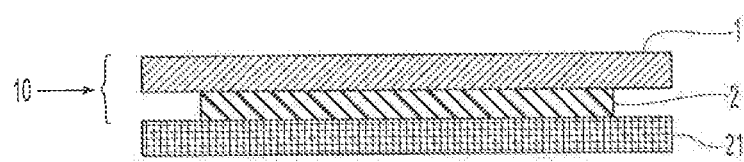
FIG. 2 is a sectional view schematically illustrating one example of a process for forming the film for use in manufacturing a semiconductor device of the present invention.

And then, by laminating the base sheet 1 on the bonding layer 2 or the releasing layer 50 of the bonding film so that the adhesive layer of the base sheet 1 makes contact with it, the film 10 with the peeling base 21, which comprises the support base of the base sheet 1, the adhesive layer of the base sheet 1, (releasing layer), the bonding layer 2 and the peeling base 21, can be obtained (see FIG. 2).

In the case where the bonding layer 2 of the film is heated from room temperature at a temperature raising rate of 10° C./min to bring it into a molten state, the bonding layer 2 in the molten state may preferably have such a property that a melt viscosity thereof is initially lowered down to a lowest value, and then is raised. In this case, the lowest value of the melt viscosity is not particularly limited to a specific value, but may be preferably in the range of 10 to 10,000 Pa·s, more preferably in the range of 100 to 3,000 Pa·s, and even more preferably in the range of 300 to 1,500 Pa·s.

By setting the lowest value of the melt viscosity to a value equal to or higher than the lower limit value noted above, it is possible to prevent a reduction in connection reliability which would occur as the bonding layer 2 is bled from an object during a heating operation, and to restrain the bonding layer 2 from contaminating neighboring members. In addition, it is possible to prevent generation of air bubbles in the bonding layer 2 and occurrence of defects such as insufficient filling of the bonding layer 2 in a gap between a semiconductor element and a substrate. Moreover, it is possible to prevent a solder from being excessively wet spread, which would lead to a problem of short-circuiting between adjacent electrical connections (electrodes).

Further, by setting the lowest value of the melt viscosity to a value equal to or lower than the upper limit value noted above, it is possible to avoid occurrence of defective bonding between electrical connections (between a solder bump and an electrode provided on a substrate), because the resin composition are prevented from remaining therebetween when metallically bonding the electrical connections together.

Further, a temperature, at which the melt viscosity of the bonding layer 2 reaches to the lowest value of the melt viscosity, is not particularly limited to a specific value, but may be preferably in the range of 120 to 180° C., and more preferably in the range of 140 to 170° C. By setting the temperature to fall within the above range, it is easy to mount a semiconductor element on a substrate using the film 10.

The melt viscosity of the bonding layer 2 is measured by the following measurement method.

Namely, a bonding layer 2 having a thickness of 100 μm is measured using a viscoelasticity measuring instrument ("Rheo Stress RS-1" produced by HAKKE Corporation) at a temperature raising rate of 10° C./min and a frequency of 1.0 Hz under a strain-constant stress sensing condition.

Further, the bonding layer 2 may have such transparency as to allow a surface of a semiconductor element to be observed through the bonding layer 2 in a state that the bonding layer 2 is bonded to the surface of the semiconductor element. This makes it possible to easily perform alignment between the semiconductor element and a substrate.

Specifically, in the case where light having a wavelength of 630 nm is passed through the bonding layer 2, transmittance of the light may be preferably 50% or more, and more preferably in the range of 70 to 100%. If the transmittance of the light falls within the above range, it is easy to observe the surface of the semiconductor element through the bonding layer 2 in a state that the bonding layer 2 is bonded to the surface of the semiconductor element. This makes it possible to reliably perform connection of electrical connections.

(Method for Manufacturing Semiconductor Device and Semiconductor Device)

Next, description will be made on an embodiment of a method for manufacturing a semiconductor device using the film 10 described above and the semiconductor device.

First, the peeling base 21 is removed from the film 10 so that the film 10 is prepared. In this regard, it is to be noted that the bonding layer 2 (and the releasing layer) is (are) formed into the same shape (in this embodiment, a circular shape) and the same size as those of a semiconductor wafer 3 described below.

Figure 3:
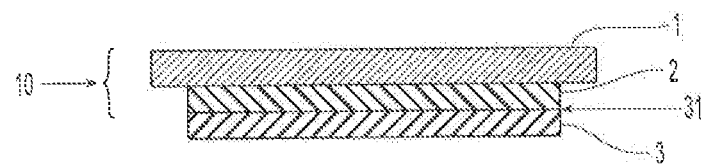
FIG. 3 is a sectional view schematically illustrating one example of a process for manufacturing a semiconductor device of the present invention.

Here, the above semiconductor wafer 3 has a functional surface 31 (one surface). Next, as shown in FIG. 3, the film 10 is laminated on the semiconductor wafer 3 so that the bonding layer 2 of the film 10 makes contact with the functional surface of the semiconductor wafer 3 (this step is a bonding step). In addition, although not shown in the drawings, it is preferred that solder bumps (protruding electrodes) have been, in advance, formed on the functional surface 31 of the semiconductor wafer 3. This makes it possible to easily manufacture a semiconductor device through a simple step in which a diced semiconductor wafer (semiconductor element) is mounted on a substrate.

Figure 4:
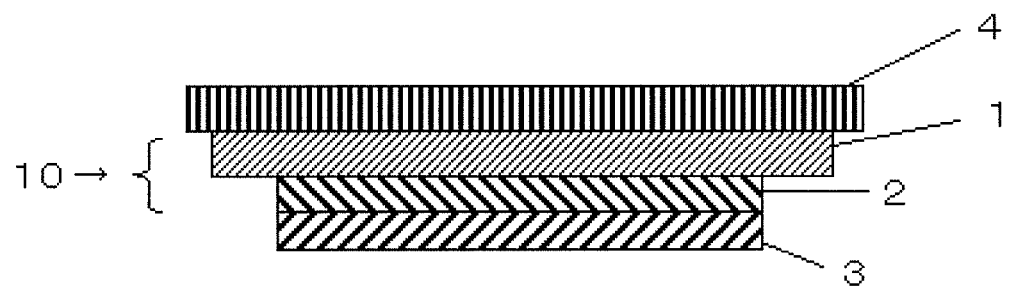
FIG. 4 is a sectional view schematically illustrating one example of a process for manufacturing a semiconductor device of the present invention.

Next, as shown in FIG. 4, an upper surface of the base sheet 1 (on the upper side of FIG. 4) is fixed to a grinding stage 4 of a grinding device. Although the grinding device is not particularly limited to a specific type, a commercially supplied grinding device may be used as the grinding device. And then, by operating the grinding device in the state that the upper surface of the base sheet 1 is fixed to the grinding stage 4 of the grinding device, a surface opposite to the functional surface (the other surface) 31 of the semiconductor wafer 3 is ground (background) (this step is a grinding step). In this regard, it is to be noted that the grinding step is not necessarily needed, and the grinding step may be omitted.

Further, a thickness of the semiconductor wafer 3 after being background is not particularly limited to a specific value, but may be in the range of about 30 to 600 μm.

In this regard, since the bonding layer 2 of the film 10 of the present invention is formed of the resin composition including the compound having flux activity, the film 10 can be directly laminated on (or bonded to) the functional surface 31 of the semiconductor element 3.

Figure 5:
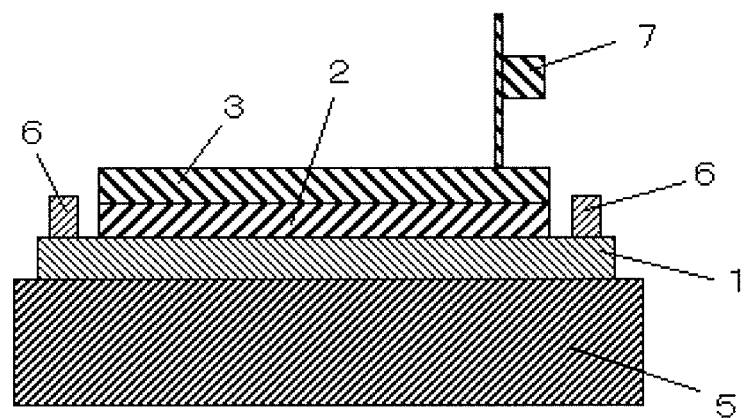
FIG. 5 is a sectional view schematically illustrating one example of a process for manufacturing a semiconductor device of the present invention.

Next, as shown in FIG. 5, the semiconductor wafer 3 after being background is mounted on a dicer table 5 so that the base sheet 1 makes contact with an upper surface of the dicer table 5 (on the upper side of FIG. 5). And then, a wafer ring 6 is mounted on the base sheet 1 around an outer peripheral portion of the semiconductor wafer 3 so that the semiconductor wafer is fixed in place. Thereafter, the semiconductor wafer 3 and the bonding layer 2 are diced by a blade 7. In this way, the semiconductor wafer 3 is segmented to thereby obtain a plurality of semiconductor elements each having a diced bonding layer 2 (this step is a dicing step). At this time, the film 10 serves to absorb shocks and to prevent occurrence of cracks or other defects in the course of dicing the semiconductor wafer 3. Alternatively, the semiconductor wafer 3 and the wafer ring 6 may be adhesively attached to the film 10 before the film 10 is mounted on the dicer table.

Next, the film 10 is expanded by an expanding device so that individual semiconductor elements each having the diced bonding layer 2 can be spaced apart from one another with a specified gap. And then, each semiconductor element with the diced bonding layer 2 is picked up (this step is a picking up step) and the semiconductor element with the diced bonding layer 2 is mounted on a substrate (this step is a mounting step). Thereafter, the bonding layer 2 is heated and cured to thereby obtain a semiconductor device in which the semiconductor element is laminated on the substrate.

As described above, in the film 10 of the present invention, the base sheet 1 can serve as a backgrinding tape and a dicing tape. Further, since the bonding layer 2 has the flux activity, a flux does not have to be used in the process of manufacturing the semiconductor device. This makes it possible to omit a step of cleaning the flux or the like in the process of manufacturing the semiconductor device. Therefore, by using the film 10, the semiconductor device can be manufactured in high productivity and the workability for processing the semiconductor wafer 3 can be improved.

Next, description will be made on another embodiment of a method for manufacturing a semiconductor device and a semiconductor device in accordance with the present invention.

Figure 6:
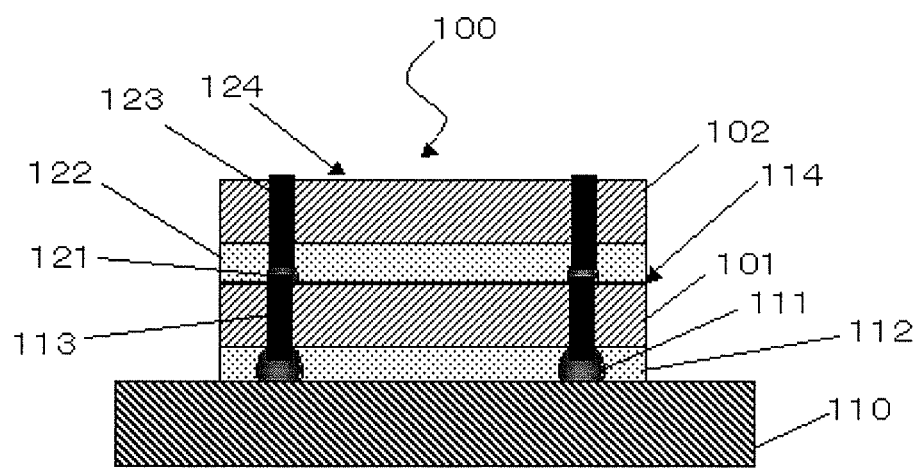
FIG. 6 is a sectional view showing one example (another embodiment) of a semiconductor device of the present invention.

First, a semiconductor device will be described based on a preferable embodiment as shown in FIG. 6.

FIG. 6 is a sectional view showing one example (another embodiment) of the semiconductor device of the present invention.

As shown in FIG. 6, a semiconductor device 100 comprises a substrate 110; a first semiconductor element (the other semiconductor element) 101 mounted on an upper side of the substrate 110 (on the upper side of FIG. 6); and a second semiconductor element 102 mounted on an upper side of the first semiconductor element 101 (on the upper side of FIG. 6). In this embodiment, a structural body, on which the second semiconductor element 102 is mounted, comprises the substrate 110 and the first semiconductor element 101.

A circuit pattern not shown in the drawing is formed on an upper surface of the substrate 110, and electronic pads (electrical connections) are provided on the upper surface of the substrate 110.

The first semiconductor element 101 and the substrate 110 are electrically connected together through solder bumps (protruding electrodes) 111. A second joint layer (the other joint layer) 112 is provided between the first semiconductor element 101 and the substrate 110 so as to protect surrounding area of the solder bumps 111 (joint portions). This second joint layer 112 is formed from a cured product of a resin composition comprising a crosslinkable resin and a compound having flux activity.

Conductive portions 113 are formed so as to pass through the first semiconductor element 101 in a thickness direction thereof. Electrical signals can be transmitted and received between a functional surface 114 of the first semiconductor element 101 and a rear surface thereof. This makes it possible to omit use of bonding wires which connect the two surfaces together. As a result, it is possible to make the semiconductor device 100 thinner. As compared with the use of the bonding wires, a transmission distance of electrical signals can be shortened, thereby improving response speed of the semiconductor device 100.

Further, the first semiconductor element 101 and the second semiconductor element 102 are also electrically connected together through solder bumps (protruding electrodes) 121. A first joint layer 122 is provided between the first semiconductor element 101 and the second semiconductor element 102 so as to protect surrounding area of the solder bumps 121 (joint portions). This first joint layer 122 is also formed from a cured product of a resin composition comprising a crosslinkable resin and a compound having flux activity.

Conductive portions 123 are formed so as to pass through the second semiconductor element 102 in a thickness direction thereof. Electrical signals can be transmitted and received between a functional surface 124 of the second semiconductor element 102 and a rear surface thereof. This makes it possible to omit use of bonding wires which connect the two surfaces together. As a result, it is possible to make the semiconductor device 100 thinner. As compared with the use of the bonding wires, a transmission distance of electrical signals can be shortened, thereby improving response speed of the semiconductor device 100.

Hereinbelow, the respective components of the semiconductor device 100 will be described.

Examples of the substrate 110 include a ceramic substrate, an organic substrate and the like. Examples of the ceramic substrate include an alumina substrate, an aluminum nitride substrate and the like can be used. Examples of the organic substrate include a polyimide film substrate obtained using a polyimide film as a substrate, a FR-4 substrate obtained by penetrating epoxy resin into a glass cross, a BT substrate into which bismaleimide-triazine resin is penetrated.

As the first semiconductor element 101, for example, a semiconductor element serving as a memory, a logic, a processor or the like can be used. Further, it is preferable to use a semiconductor element having a size of 1 to 20 mm square.

A size (height) of each solder bump (protruding electrode) 111 connecting the first semiconductor element 101 and the substrate 100 together is not particularly limited to a specific value, but may be preferably in the range of 10 to 600 μm, and more preferably in the range of 30 to 200 μm.

As described above, the second joint layer 112 is provided so as to protect the surrounding area of the solder bumps 111 and formed from the cured product of the resin composition comprising the crosslinkable resin and the compound having flux activity. As the resin composition of the second joint layer 112, the same resin composition constituting the bonding layer 2 of the film 10 described above can be used.

Further, the second joint layer 112 protecting the surrounding area of the solder bumps 111 may be formed from a so-called underfill material. It is preferable to use a liquid type underfill material prepared by adding a curing agent, an inorganic filler, various kinds of coupling agents and the like to one of an epoxy based resin, a polyamide based resin, a polyimide based resin, a maleimide based resin, a fluorine based resin, a silicon based resin and the like or a mixture thereof.

The underfill material is applied on the substrate 110 along one side or a plurality of sides of the first semiconductor element 101 provided on the substrate 110, flowed into a gap between the substrate 110 and the first semiconductor element 101 by utilizing capillary phenomenon. Thereafter, the underfill material is cured to form a cured product thereof which can protect the electrical connections (electrodes).

As the second semiconductor element 102, for example, a semiconductor element serving as a memory, a logic, a processor or the like can be used. Further, it is preferable to use a semiconductor element having the same size as that of the first semiconductor element 101, that is, a size of 1 to 20 mm square.

A size (height) of each solder bump 121 connecting the second semiconductor element 102 and the first semiconductor element 101 together is not particularly limited to a specific value, but may be preferably in the range of 10 to 300 μm, and more preferably in the range of 20 to 100 μm.

Further, as described above, the first joint layer 122 is also provided so as to protect the surrounding area of the solder bumps 121 and formed from the cured product of the resin composition comprising the crosslinkable resin and the compound having flux activity. As the resin composition of the first joint layer 122, the same resin composition constituting the bonding layer 2 of the film 10 described above also can be used.

By forming the first joint layer 122 from the cured product of the resin composition as mentioned above, the solder bumps (electrodes) 121 can be protected, thereby improving connection reliability of the semiconductor device 100.

Next, description will be made on a method for manufacturing a semiconductor device 100.

Figure 7:
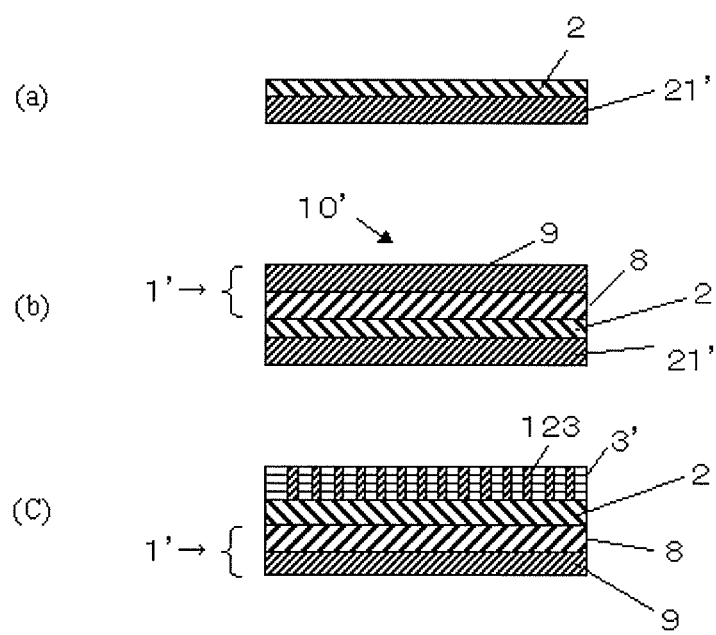
FIG. 7 is a sectional view illustrating one example (another embodiment) of a process for manufacturing the semiconductor device of the present invention.

FIG. 7 is a sectional view showing one example (another embodiment) of a semiconductor device of the present invention.

First, a laminated body comprising the base sheet 1 and the bonding layer 2 which is formed of the resin composition comprising the crosslinkable resin and the compound having flux activity, that is, a film 10' identical to the film 10 is formed.

In this regard, it is to be noted that the film 10' of this embodiment comprises a base sheet 1' including a support base 9 and an adhesive layer 8 provided on the support base 9 and the bonding layer 2.

In order to form such a film 10', first, as shown in FIG. 7(a), the bonding layer 2 can be formed by applying a liquid material, which is prepared by mixing the resin composition including the crosslinkable resin and the compound having flux activity, on a peeling base 21', and then drying the liquid material. By half cutting only the bonding layer 2 formed on the peeling base 21', the bonding layer 2 can be cut into the same shape as that of a semiconductor wafer, for example, a circular shape. In this case, a bonding film comprising the bonding layer 2 and the peeling base 21' can be obtained.

Further, in the case where the film 10' includes the releasing layer provided between the base sheet 1' and the bonding layer 2, the bonding layer 2 can be formed by applying a liquid material, which is prepared by mixing the resin composition including the crosslinkable resin and the compound having flux activity, on the releasing layer, and then drying the liquid material at a predetermined temperature. Further, by half cutting only the bonding layer 2 together with the releasing layer after laminating the peeling base 21' on the bonding layer 2, the releasing layer and the bonding layer 2 can be cut into the same shape as that of a semiconductor wafer, for example, a circular shape. In this case, a bonding film comprising the releasing layer, the bonding layer 2 and the peeling base 21' can be obtained.

Next, by laminating the bonding film comprising (the releasing layer), the bonding layer 2 and the peeling base 21' on the base sheet 1' comprising the support base 9 and the adhesive layer 8 using a laminator or the like so that the bonding layer 2 or the releasing layer of the bonding film makes contact with the adhesive layer 8 of the base sheet 1', to obtain a film 10' with the peeling base 21' (see FIG. 7(b)).

Next, as shown in FIG. 7(c), the film 10' is removed from the peeling base 21', and then laminated on the semiconductor wafer 3' in which a plurality of conductive portions 123 are formed so as to pass through the semiconductor wafer 3' in a thickness direction thereof so that the bonding layer 2 of the film 10' makes contact with one surface of the semiconductor wafer 3' (lower surface positioned on the lower side of FIG. 7(c)) (this step is a bonding step).

Next, the semiconductor wafer 3' is mounted on a dicer table (not shown in the drawings) so that the support base 9 of the base sheet 1' makes contact with an upper surface of the dicer table. And then, a wafer ring is mounted on the base sheet 1' around an outer peripheral portion of the semiconductor wafer 3' so that the semiconductor wafer 3' is fixed in place. Thereafter, the semiconductor wafer 3' and the bonding layer 2 are diced. In this way, the semiconductor wafer 3' is segmented into a plurality of semiconductor elements each including the conductive portions 123 formed so as to pass through the semiconductor wafer 3' in the thickness direction thereof and having a diced bonding layer 2 (this step is a dicing step).

Next, the film 10' is expanded by an expanding device so that individual second semiconductor elements 102 each having the diced bonding layer 2 can be spaced apart from one another with a specified gap. And then, each second semiconductor element 102 with the diced bonding layer 2 is picked up (this step is a picking up step) and the second semiconductor element 102 with the diced bonding layer 2 is mounted on a substrate on which the first semiconductor element 101 has been, in advance, mounted (this step is a mounting step). Thereafter, the diced bonding layer 2 is heated and cured so that the first joint layer 122 is formed to thereby obtain a semiconductor device 100 in which the two semiconductor elements 101 and 102 are laminated on the substrate.

As described above, according to the present invention, since the bonding layer 2 has the flux activity, a flux does not have to be used when the first and second semiconductor elements 101 and 102 are connected together through a solder. Further, according to the present invention, the bonding layer 2 also can exhibit superior anti-reflowability.

In this regard, in the above embodiment, the semiconductor device includes the two semiconductor elements laminated together, but may include 3, 4 or more semiconductor elements laminated together. Further, the first semiconductor element 101 also may be mounted on the substrate in the same manner as the second semiconductor element 102.

EXAMPLES

Hereinafter, the present invention will be described in detail based on Examples and Comparative Examples. However, the present invention is not limited thereto.

Example A1

1A. Formation of Bonding Film 47.00 wt % of an epoxy resin having an epoxy equivalent of 200 g/eq ("NC6000" produced by Nippon Kayaku Co., Ltd.)

as a crosslinkable resin; 19.51 wt % of an acrylic acid ester copolymer (butyl acrylate-ethyl acrylate-acrylonitrile-acrylic acid hydroxyethyl acrylate copolymer) having a weight average molecular weight of 500,000 ("SG-708-6" produced by Nagase Chemtex Corp.) and 9.75 wt % of an acryl resin (acrylic acid-styrene copolymer) having a weight average molecular weight of 5,500 ("UC-3900" produced by Toagosei Co., Ltd.) as a resin having film-forming property; 10.26 wt % of a solid phenol resin having a hydroxyl group equivalent of 104 g/OH group ("PR-53647" produced by Sumitomo Bakelite Co., Ltd.) as a curing agent; 0.08 wt % of an imidazole compound ("2P4MHZ" produced by Shikoku Chemicals Corp.) as an accelerator; 12.88 wt % of phenolphthalein as a flux compound; and 0.52 wt % of propyl trimethoxysilane ("KBM303" produced by Shin-Etsu Chemical Co., Ltd.) as a coupling agent were dissolved in methyl ethyl ketone (MEK), to thereby obtain a resin varnish having a resin solid content of 40%.

This resin varnish was applied on a releasing layer formed from a polyethylene terephthalate film having a thickness of 15 μm using a comma coater, and then dried for 5 minutes at 90° C., to thereby obtain a bonding layer having a thickness of 40 μm on the releasing layer. Thereafter, a peeling base (a cover film) formed from a polyester sheet having a thickness of 38 μm was laminated on the bonding layer, to thereby obtain a bonding film comprising the peeling base, the bonding layer and the releasing layer.

2A. Formation of Adhesive Film

A support base was obtained by forming Cleartech CT-H717 (produced by Kuraray Co., Ltd.) into a film having a thickness of 100 μm using an extruder, and then subjecting a surface of the film to a corona treatment.

A copolymer having a weight average molecular weight of 500,000 was obtained through polymerization of 50 parts by weight of acrylic acid 2-ethylhexyl, 10 parts by weight of acrylic acid butyl, 37 parts by weight of vinyl acetate and 3 parts by weight of methacrylic acid 2-hydroxyethyl. The copolymer was applied on a peeling base (cover film) formed from a polyester film having a thickness of 38 μm which was subjected to a peeling treatment, and then dried for 5 minutes at 80° C. to obtain an adhesive layer having a thickness of 10 μm. Thereafter, the adhesive layer was laminated on the corona-treated surface of the support base mentioned above. In this way, obtained was an adhesive film (sheet base with peeling base (cover film)) which was formed from the sheet base consisting of the support base and the adhesive layer and the peeling base (cover film).

3A. Formation of Film for Use in Manufacturing Semiconductor Device

The releasing layer and the bonding layer of the above bonding film were half cut so as to leave a portion to be bonded to a semiconductor wafer. Thereafter, the peeling base (cover film) was removed from the adhesive layer of the adhesive film, and then the adhesive film was attached to the bonding film so that the adhesive layer of the adhesive film made contact with the releasing layer of the bonding film, to thereby obtain a film for use in manufacturing a semiconductor device to which the peeling base (cover film) was attached. In such a film, the support base of the base sheet, the adhesive layer of the base sheet, the releasing layer, the bonding layer and the peeling base (cover film) were laminated together in this order.

4A. Manufacturing of Semiconductor Device

The peeling base (cover film) was removed from the film for use in manufacturing a semiconductor device, and then the bonding layer of the film was attached to a surface of a semiconductor wafer having a diameter of 8 inches and a thickness of 725 μm, the surface on which bumps were provided, at a temperature of 110° C. and at a pressure of 0.3 MPa. In this way, the film for use in manufacturing a semiconductor device was bonded to the semiconductor wafer. Next, as shown in FIG. 4, an upper surface of the base sheet (support base) is fixed to a grinding stage 4 of a grinding device, and then the semiconductor wafer was ground down to a thickness of 100 μm.

Next, as shown in FIG. 5, this semiconductor wafer was mounted on a dicer table 5 so that the support base of the base sheet 1 made contact with an upper surface of the dicer table 5, and then the semiconductor wafer and the bonding layer were diced (or cut) in a size of 5 mm×5 mm square using a dicing saw at a spindle rotation speed of 30,000 rpm and a dicing speed of 50 mm/sec.

Then, the bonding layer and the releasing layer were separated from each other by thrusting up the film for use in manufacturing a semiconductor device from a rear surface thereof, thereby obtaining a plurality of semiconductor elements each having a diced bonding layer. In this regard, each semiconductor element had 225 Sn3Ag0.5Cu bumps each having a size of 60 μmΦ, the bumps whose pitch was 200 μm, and was provided with a PI protective layer (produced by Hitachi VLSI Inc.). Each semiconductor element was positioned with respect to a BT (bismaleimide triazine resin) substrate having a thickness of 0.8 μm and coated with solder resist ("AUS308" produced by Taiyo Ink Mfg. Co., Ltd.) using a flip-chip bonder, and then subjected to pressure bonding for 10 sec at 250° C., to thereby obtain 20 flip-chip packages. The flip-chip packages were post-cured for 1 hour at 180° C. to obtain semiconductor devices.

In this regard, it is to be noted that transmittance of light in the bonding layer was 97%.

Example A2

20 semiconductor devices were obtained in the same manner as Example A1, except that 29.26 wt % of the acrylic acid ester copolymer (butyl acrylate-ethyl acrylate-acrylonitrile-acrylic acid hydroxyethyl acrylate copolymer) having the weight average molecular weight of 500,000 ("SG-708-6" produced by Nagase Chemtex Corp.) was only used as the resin having film-forming property, that is, the acryl resin (acrylic acid-styrene copolymer) having the weight average molecular weight of 5,500 ("UC-3900" produced by Toagosei Co., Ltd.) was not used.

In this regard, it is to be noted that transmittance of light in the bonding layer was 97%.

Example A3

20 semiconductor devices were obtained in the same manner as Example A1, except that a resin varnish prepared as follows was used. Specifically, 37.60 wt % of the epoxy resin having the epoxy equivalent of 200 g/eq ("NC6000" produced by Nippon Kayaku Co., Ltd.) as the crosslinkable resin; 15.60 wt % of the acrylic acid ester copolymer (butyl acrylate-ethyl acrylate-acrylonitrile-acrylic acid hydroxyethyl acrylate copolymer) having the weight average molecular weight of 500,000 ("SG-708-6" produced by Nagase Chemtex Corp.) and 7.80 wt % of the acryl resin (acrylic acid-styrene copolymer) having the weight average molecular weight of 5,500 ("UC-3900" produced by Toagosei Co., Ltd.) as the resin having film-forming property; 8.21 wt % of the solid phenol resin having the hydroxyl group equivalent of 104 g/OH group ("PR-53647" produced by Sumitomo Bakelite Co., Ltd.) as the curing agent; 0.07 wt % of the imidazole compound ("2P4MHZ" produced by Shikoku Chemicals Corp.) as the accelerator; 10.30 wt % of the phenolphthalein as the flux compound; and 0.42 wt % of the propyl trimethoxysilane ("KBM303" produced by Shin-Etsu Chemical Co., Ltd.) as the coupling agent were dissolved in the methyl ethyl ketone (MEK), and then 20.00 wt % of silica having an average particle size of 0.02 μm ("Quotron SP-03B" produced by Fuso Chemical Co., Ltd.) was added and dispersed thereinto, to thereby obtain a resin varnish having a resin solid content of 40%.

In this regard, it is to be noted that transmittance of light in the bonding layer was 52%.

Example A4

20 semiconductor devices were obtained in the same manner as Example A1, except that a resin varnish prepared as follows was used. Specifically, 50.00 wt % of an epoxy resin having an epoxy equivalent of 180 g/eq ("EPICLON 840S" produced by Dainippon Ink And Chemicals, Incorporated) as the crosslinkable resin; 20.00 wt % of a phenoxy resin ("YL-6954" produced by Japan Epoxy Resins Co., Ltd.) as the resin having film-forming property; 25.00 wt % of the solid phenol resin having the hydroxyl group equivalent of 104 g/OH group ("PR-53647" produced by Sumitomo Bakelite Co., Ltd.) as the curing agent; 0.50 wt % of a phosphorus compound (molecular compound of tetraphenyl phosphine, phenyl trimethoxysilane and 2,3-dihydroxynaphthalene) as the accelerator; and 4.50 wt % of sebacic acid as the flux compound were dissolved in the methyl ethyl ketone (MEK), to thereby obtain a resin varnish having a resin solid content of 40%.

In this regard, it is to be noted that transmittance of light in the bonding layer was 98%.

Example A5

20 semiconductor devices were obtained in the same manner as Example A1, except that a film for use in manufacturing a semiconductor device in which the releasing layer was omitted was used. The film for use in manufacturing a semiconductor device was formed as follows.

Namely, the above-mentioned resin varnish was applied on a peeling base (cover film) formed from a polyester film having a thickness of 38 μm using a comma coater, and then dried for 5 minutes at 90° C. so that a bonding layer having a thickness of 40 μm was formed on the peeling base (cover film), to thereby obtain a bonding film comprising the peeling base and the bonding layer.

The bonding layer of the above bonding film was half cut so as to leave a portion to be bonded to a semiconductor wafer. Thereafter, the peeling base (cover film) was removed from the adhesive layer of the above-mentioned adhesive film, and then the adhesive film was attached to the bonding film so that the adhesive layer of the adhesive film made contact with the bonding layer of the bonding film, to thereby obtain a film for use in manufacturing a semiconductor device to which the peeling base (cover film) was attached. In such a film, the support base of the base sheet, the adhesive layer of the base sheet, the bonding layer and the peeling base (cover film) were laminated together in this order.

In this regard, it is to be noted that transmittance of light in the bonding layer was 97%.

Comparative Example A1

20 semiconductor devices were obtained in the same manner as Example A1, except that a resin varnish prepared as follows was used. Specifically, 62.12 wt % of an acrylic acid ester copolymer (butyl acrylate-ethyl acrylate-acrylonitrile copolymer) having a weight average molecular weight of 850,000 ("SG-PZ" produced by Nagase Chemtex Corp.) as the resin having film-forming property; 12.88 wt % of the phenolphthalein as the flux compound were dissolved in the methyl ethyl ketone (MEK), and then 25.00 wt % of silica having an average particle size of 0.02 μm ("Quotron SP-03B" produced by Fuso Chemical Co., Ltd.) was added and dispersed thereinto, to thereby obtain a resin varnish having a resin solid content of 40%.

In this regard, it is to be noted that transmittance of light in the bonding layer was 98%.

Comparative Example A2

20 semiconductor devices were obtained in the same manner as Example A1, except that a resin varnish prepared as follows was used. Specifically, the resin varnish was prepared by omitting the use of the phenolphthalein which was the flux compound and changing the amount of the solid phenol resin having the hydroxyl group equivalent of 104 g/OH group ("PR-53647" produced by Sumitomo Bakelite Co., Ltd.) to 23.14 wt %.

In this regard, it is to be noted that transmittance of light in the bonding layer was 96%.

Comparative Example A3

A backgrinding tape ("ICROS TAPE" produced by Mitsui Chemicals, Inc) was attached to a semiconductor wafer having a thickness of 725 μm. Thereafter, the semiconductor wafer was fixed to a grinding device so that the backgrinding tape made contact with a grinding stage of the grinding device, and then was ground down to a thickness of 100 μm.

Next, the backgrinding tape was removed from the semiconductor wafer, and then a dicing sheet ("SUMILITE FSL" produced by Sumitomo Bakelite Co., Ltd.) was attached thereto. Thereafter, the semiconductor wafer was mounted on a dicer table so that the dicing sheet made contact with an upper surface of the dicer table, and then diced (or cut) in a size of 5 mm×5 mm square using a dicing saw at a spindle rotation speed of 30,000 rpm and a dicing speed of 50 mm/sec, to thereby obtain a plurality of semiconductor elements. In this regard, each semiconductor element had 225 Sn3Ag0.5Cu bumps each having a size of 60 μmΦ, the bumps whose pitch was 200 μm, and was provided with a PI protective layer (produced by Hitachi VLSI Inc.).

Next, a flux was applied on a functional surface of each semiconductor element. This semiconductor element was positioned with respect to a BT (bismaleimide triazine resin) substrate having a thickness of 0.8 μm and coated with solder resist ("AUS308" produced by Taiyo Ink Mfg. Co., Ltd.) using a flip-chip bonder, and then subjected to pressure bonding for 10 sec at 250° C., to thereby obtain 20 flip-chip packages. Next, a redundant flux was removed from the flip-chip packages using a flux cleaning fluid. Thereafter, a gap between the semiconductor element and the substrate of each flip-chip package was filled with a liquid sealing resin, and then the liquid sealing resin was cured for 2 hours at 150° C., to thereby semiconductor devices.

The semiconductor devices obtained in the foregoing Examples and Comparative Examples were subjected to the following evaluation. Results of the evaluation are shown in Table 1.

1. Productivity

Based on the number of the manufacturing steps of the semiconductor device in Comparative Example A3, the productivity of each of Examples and the other Comparative Examples was evaluated. The symbols in Table 1 are defined as follows. Further, the symbol "-" in Table 1 means that the evaluation could not be performed.

A: In the case where the number of the manufacturing steps of the semiconductor device in Comparative Example A3 was defined as "100", the number of the manufacturing steps was 40 or more, but less than 60.

B: In the case where the number of the manufacturing steps of the semiconductor device in Comparative Example A3 was defined as "100", the number of the manufacturing steps was 60 or more, but less than 80.

C: In the case where the number of the manufacturing steps of the semiconductor device in Comparative Example A3 was defined as "100", the number of the manufacturing steps was 80 or more, but less than 100.

D: In the case where the number of the manufacturing steps of the semiconductor device in Comparative Example A3 was defined as "100", the number of the manufacturing steps was 100 or more.

2. Exudation of Bonding Layer

Exudation of the bonding layer was visually evaluated in each semiconductor device. The symbols in Table 1 are defined as follows.

A: The exudation of the bonding layer was hardly observed.

B: The exudation of the bonding layer was observed, but a width of the exudation was less than 1 mm.

C: The exudation of the bonding layer was observed, and a width of the exudation was 1 mm or more, but 5 mm or less.

D: The exudation of the bonding layer was observed, and a width of the exudation was 5 mm or more.

3. Connection Reliability

Connection reliability was evaluated based on whether or not electrical conduction was observed in each semiconductor device after it was subjected to a heat cycle test.

Specifically, connection resistance between the semiconductor element and the substrate was measured using a digital multi meter. The measurement was carried out just after each semiconductor device was manufactured and after 1,000 cycles of the heat cycle test including a step of maintaining it for 1 hour at −65° C. and a step of maintaining the semiconductor device for 1 hour at 150° C. were finished. The symbols in Table 1 are defined as follows.

A: Among 20 semiconductor devices, electrical conduction was observed in 20 semiconductor devices.

B: Among 20 semiconductor devices, electrical conduction was observed in 18 to 19 semiconductor devices.

C: Among 20 semiconductor devices, electrical conduction was observed in 16 to 17 semiconductor devices.

D: Among 20 semiconductor devices, electrical conduction was observed in 0 to 16 semiconductor devices.

TABLE 1

| | Component | Chemical structure etc | Ex. A1 | Ex. A2 | Ex. A3 | Ex. A4 | Ex. A5 | Com. Ex. A1 | Com. Ex. A2 | Com. Ex. A3 |
|---|---|---|---|---|---|---|---|---|---|---|
| Resin having film-forming property | High heat-resistant phenoxy resin | "YL-6954"[*1] | | | | 20.00 | | | | |
| | Acrylic rubber | "SG-708-6"[*2] | 19.51 | 29.26 | 15.60 | | 19.51 | | 19.51 | |
| | | "UC-3900"[*3] | 9.75 | | 7.80 | | 9.75 | | 9.75 | |
| | | "SG-PZ"[*4] | | | | | | 62.12 | | |
| Curable resin | Curable component | Epoxy resin | "Epiclon840S"[*5] | | | | 50.00 | | | | |
| | | Epoxy resin | "NC6000"[*6] | 47.00 | 47.00 | 37.60 | | 47.00 | | 47.00 | |
| | Curing agent | Phenol novolak | "PR-53647"[*7] | 10.26 | 10.26 | 8.21 | 25.00 | 10.26 | | 23.14 | |
| | | Imidazole | "2P4MHZ"[*8] | 0.08 | 0.08 | 0.07 | | 0.08 | | 0.08 | |
| | | Phosphorus compound | [*9] | | | | 0.50 | | | | |
| Compound having flux activity | Sebacic acid | | | | | 4.50 | | | | |
| | Phenolphthalein | | 12.88 | 12.88 | 10.30 | | 12.88 | 12.88 | | |
| Additive | Adhesive agent | Silane coupling agent | "KBM303"[*10] | 0.52 | 0.52 | 0.42 | | 0.52 | | 0.52 | |
| | Filler | Silica | "Quotron SP-03B"[*11] | | | | 20.00 | | | 25.00 | |
| Transmittance of light having a wavelength of 600 nm (%) | | | 97 | 97 | 52 | 98 | 97 | 98 | 96 | — |
| Lowest value of the melt viscosity (Pa · s) and Temperature (° C.) at which the melt viscosity of the bonding layer reaches to the lowest value of the melt viscosity | | [*12] | 400 | 3000 | 1000 | 20 | 400 | 3000 | 300 | — |
| | | [*13] | 150 | 150 | 150 | 150 | 150 | 115 | 184 | — |
| Productivity | | | A | A | A | A | A | — | — | D |
| Exudation of bonding layer | | | B | A | A | B | B | A | B | B |
| Connection reliability | | | A | B | B | A | A | D | D | B |

[*1]"YL-6954" is produced by Japan Epoxy Resins Co., Ltd.

[*2]"SG-708-6" is a 16 mol % butyl acrylate - 46 mol % ethyl acrylate - 34 mol % acrylonitrile - 2.5 mol % acrylic acid - 1.3 mol % hydroxyethyl copolymer having a molecule weight of 500,000.

[*3]"UC-3900" is produced by Toagosei Co., Ltd.

[*4]"SG-PZ" is a 30 mol % butyl acrylate - 30 mol % ethyl acrylate - 40 mol % acrylonitrile copolymer having a molecule weight of 850,000.

[*5]"Epiclon840S" is a liquid bis A type epoxy resin having an epoxy equivalent of 180 and produced by Dainippon ink and chemicals, Incorporated.

[*6]"NC6000" is a solid three functional epoxy resin having a softening point of 60° C. and produced by Nippon Kayaku Co., Ltd.

[*7]"PR-53647" is a resin having a softening point of 95° C. and an OH equivalent of 104 and produced by Sumitomo Bakelite Co., Ltd.

[*8]"2P4MHZ" is 2-phenyl-4-methyl-5-hydroxyimidazole and produced by Shikoku Chemicals Corporation.

[*9]"Phosphorus compound" is a molecular compound of tetraphenyl phosphine, phenyl trimethoxysilane and 2,3-dihydroxynaphthalene.

[*10]"KBM303" is β- (3,4-epoxycyclohexyl) ethyl trimethoxysilane and produced by Shin-Etsu Chemical Co., Ltd.

[*11]"Quotron SP-03B" is silica having an average particle size of 0.02 μm and produced by Fuso Chemical Co., Ltd.

[*12]Lowest value of the melt viscosity (Pa · s)

[*13]Temperature (° C.) at which the melt viscosity of the bonding layer reaches to the lowest value of the melt viscosity In the method for manufacturing a semiconductor device using the film obtained in each of Examples A1 to A5, since a step of cleaning a flux was not needed, it was confirmed that the productivity of the semiconductor device was excellent.

Further, as can be seen in Table 1, in each of the semiconductor devices obtained in Examples A1 to A5 (especially, in each of the semiconductor device obtained in Examples A2 and A3), it was confirmed that the exudation of the bonding layer was prevented.

Furthermore, each of the semiconductor devices obtained in Examples A1 to A5 (especially, each of the semiconductor devices obtained in Examples A1, A4 and A5) also had superior connection reliability.

Example B1

1B. Formation of Bonding Film

First, a resin varnish was prepared in the same manner as Example A1.

Next, this resin varnish was applied on a releasing layer formed from a polyethylene terephthalate film having a thickness of 38 μm using a comma coater, and then dried for 5 minutes at 90° C. so that a bonding layer having a thickness of 35 μm was formed on the releasing layer, to thereby obtain a bonding film comprising the bonding layer and the releasing layer.

2B. Formation of Adhesive Film

Next, an adhesive film was formed in the same manner as Example A1.

3B. Formation of Film for Use in Manufacturing Semiconductor Device

Next, a film for use in manufacturing a semiconductor device was formed in the same manner as Example A5.

4B. Production of Second Semiconductor Element

The peeling base (cover film) was removed from the film for use in manufacturing a semiconductor device, and then the bonding layer of the film was attached to a rear surface of a semiconductor wafer having a diameter of 8 inches and a thickness of 100 μm at a temperature of 110° C. and at a pressure of 0.3 MPa. In this way, the film for use in manufacturing a semiconductor device was bonded to the semiconductor wafer.

Next, this semiconductor wafer was diced (or cut) in a size of 7 mm×7 mm square using a dicing saw at a spindle rotation speed of 30,000 rpm and a dicing speed of 50 mm/sec. Then, the adhesive layer and the bonding layer were separated from each other by thrusting up the film for use in manufacturing a semiconductor device from a rear surface thereof, thereby obtaining a plurality of semiconductor elements each having a diced bonding layer. In this regard, each semiconductor element had 480 electrodes each having a post diameter of 30 μm and a height of 20 μm, the electrodes whose pitch was 50 μm, and SnAg solders each having a height of 10 μm.

5B. Manufacturing of Semiconductor Device 20 semiconductor devices were obtained. Each semiconductor device was manufactured as follows. Namely, prepared was a BT (bismaleimide triazine resin) substrate having a thickness of 0.8 μm and coated with solder resist ("AUS308" produced by Taiyo Ink Mfg. Co., Ltd.) on which a first semiconductor element had been, in advance, mounted. In this regard, the first semiconductor element had a size of 7 mm×7 mm square and a thickness of 100 μm, and had 480 electrodes each having a post diameter of 30 μm and a height of 20 μm, the electrodes which pitch was 50 μm, and SnAg solders each having a height of 10 μm. The second semiconductor element was positioned with respect to the first semiconductor element so that the bonding layer, with which the second semiconductor element was provided, made contact with the first semiconductor element using a flip-chip bonder, and then subjected to pressure bonding for 10 sec at 250° C. Thereafter, the bonding layer was cured by being heated for 60 minutes at 180° C., to thereby obtain a semiconductor device in which the two semiconductor elements were laminated together.

Example B2

20 semiconductor devices were obtained in the same manner as Example B1, except that 29.26 wt % of an acrylic acid ester copolymer (butyl acrylate-ethyl acrylate-acrylonitrile-acrylic acid hydroxyethyl acrylate copolymer) having a weight average molecular weight of 500,000 ("SG-708-6" produced by Nagase Chemtex Corp.) was only used as the resin having film-forming property, that is, the acryl resin (acrylic acid-styrene copolymer) having the weight average molecular weight of 5,500 ("UC-3900" produced by Toagosei Co., Ltd.) was not used.

Example B3

20 semiconductor devices were obtained in the same manner as Example B1, except that a resin varnish prepared as follows was used. Specifically, 37.60 wt % of the epoxy resin having the epoxy equivalent of 200 g/eq ("NC6000" produced by Nippon Kayaku Co., Ltd.) as the crosslinkable resin; 15.60 wt % of an acrylic acid ester copolymer (butyl acrylate-ethyl acrylate-acrylonitrile-acrylic acid hydroxyethyl acrylate copolymer) having a weight average molecular weight of 500,000 ("SG-708-6" produced by Nagase Chemtex Corp.) and 7.80 wt % of the acryl resin (acrylic acid-styrene copolymer) having the weight average molecular weight of 5,500 ("UC-3900" produced by Toagosei Co., Ltd.) as the resin having film-forming property; 8.21 wt % of the solid phenol resin having the hydroxyl group equivalent of 104 g/OH group ("PR-53647" produced by Sumitomo Bakelite Co., Ltd.) as the curing agent; 0.07 wt % of the imidazole compound ("2P4MHZ" produced by Shikoku Chemicals Corp.) as the accelerator; 10.30 wt % of the phenolphthalein as the flux compound; and 0.42 wt % of the propyl trimethoxysilane ("KBM303" produced by Shin-Etsu Chemical Co., Ltd.) as the coupling agent were dissolved in the methyl ethyl ketone (MEK), and then 20.00 wt % of silica having an average particle size of 0.02 μm ("Quotron SP-03B" produced by Fuso Chemical Co., Ltd.) was added and dispersed thereinto, to thereby obtain a resin varnish.

Example B4

20 semiconductor devices were obtained in the same manner as Example B1, except that a resin varnish prepared as follows was used. Specifically, 62.5 wt % of an epoxy resin having an epoxy equivalent of 180 g/eq ("EPICLON 840S" produced by Dainippon Ink And Chemicals, Incorporated) as the crosslinkable resin; 25.00 wt % of a phenoxy resin ("YL-6954" produced by Japan Epoxy Resins Co., Ltd.) as the resin having film-forming property; 31.30 wt % of the solid phenol resin having the hydroxyl group equivalent of 104 g/OH group ("PR-53647" produced by Sumitomo Bakelite Co., Ltd.) as the curing agent; 0.50 wt % of a phosphorus compound (molecular compound of tetraphenyl phosphine, phenyl trimethoxysilane and 2,3-dihydroxynaphthalene) as the accelerator; and 5.70 wt % of sebacic acid as the flux compound were dissolved in the methyl ethyl ketone (MEK), to thereby obtain a resin varnish having a resin solid content of 40%.

Comparative Example B1

20 semiconductor devices were obtained. Each semiconductor device was manufactured as follows. Namely, a semiconductor wafer was diced (or cut) in a size of 7 mm×7 mm square using a dicing saw at a spindle rotation speed of 30,000 rpm and a dicing speed of 50 mm/sec, to thereby obtain a plurality of first semiconductor elements.

Next, a flux was applied on a rear surface (opposite surface to functional surface) of the first semiconductor element. This first semiconductor element was positioned with respect to a BT (bismaleimide triazine resin) substrate having a thickness of 0.8 μm and coated with solder resist ("AUS308" produced by Taiyo Ink Mfg. Co., Ltd.) using a flip-chip bonder, and then subjected to pressure bonding for 10 sec at 250° C., to thereby obtain a first flip-chip package.

Next, a redundant flux was removed from the first flip-chip package using a flux cleaning fluid. Thereafter, a gap between the first semiconductor element and the substrate was filled with a liquid sealing resin ("CRP-4152D1" produced by Sumitomo Bakelite Co., Ltd.), and then the liquid sealing resin was cured for 2 hours at 150° C.

On the other hand, another semiconductor wafer was diced (or cut) in a size of 5 mm×5 mm square using a dicing saw at a spindle rotation speed of 30,000 rpm and a dicing speed of 50 mm/sec, to thereby obtain a plurality of second semiconductor elements. In this regard, each second semiconductor element had 480 electrodes each having a post diameter of 30 μm and a height of 20 μm, the electrodes whose pitch was 50 μm, and SnAg solder having a height of 10 μm.

Next, a flux was applied on a rear surface (opposite surface to functional surface) of the second semiconductor element. This second semiconductor element was positioned with respect to the first semiconductor element using a flip-chip bonder, and then subjected to pressure bonding for 10 sec at 250° C., to thereby obtain a second flip-chip package. Then, a redundant flux was removed from the second flip-chip package using a flux cleaning fluid. Thereafter, a gap between the first semiconductor element and the second semiconductor element was filled with a liquid sealing resin ("CRP-4120B2" produced by Sumitomo Bakelite Co., Ltd.), and then the liquid sealing resin was cured for 2 hours at 150° C. In this way, a semiconductor device was obtained.

The semiconductor devices obtained in the foregoing Examples and Comparative Examples were subjected to the following evaluation. Results of the evaluation are shown in Table 2.

1. Connection Reliability

Connection reliability was evaluated based on whether or not electrical conduction was observed in each semiconductor device after it was subjected to a heat cycle test.

This evaluation was carried out in the same manner as the above-mentioned connection reliability evaluation.

2. Anti-Reflowability

Anti-reflowability was evaluated by checking each semiconductor device subjected to a moisture absorption treatment in 85% RH, for 168 hours at 85° C. and three IR reflow treatments at 260° C. using a scanning supersonic detector (SAT).

A: Occurrence of cracks was hardly observed.

B: The number of cracks which occurred in each semiconductor device was 2 or less.

C: The number of cracks which occurred in each semiconductor device was 2 or more, and 5 or less.

D: The number of cracks which occurred in each semiconductor device was 6 or more.

3. Productivity

Based on the number of the manufacturing steps of the semiconductor device in Comparative Example B1, the productivity of each of Examples and the other Comparative Examples was evaluated. This evaluation was carried out in the same manner as the above-mentioned productivity evaluation.

TABLE 2

| | Component | Chemical structure etc | Ex. B1 | Ex. B2 | Ex. B3 | Ex. B4 | Com. Ex. A1 |
|---|---|---|---|---|---|---|---|
| Crosslinkable resin | Epoxy resin | "NC6000"*1 | 47.0 | 47.0 | 37.60 | | |
| | Epoxy resin | "Epiclon840S"*2 | | | | 50.00 | |
| Compound having flux activity | Phenolphthalin | | 12.88 | 12.88 | 10.30 | | |
| | Sebacic acid | | | | | 4.50 | |
| Curing agent | Phenol resin | "PR-53647"*3 | 10.26 | 10.26 | 8.21 | 25.00 | |
| | Imidazole | "2P4MHZ"*4 | 0.08 | 0.08 | 0.07 | | |
| | Phosphorus compound | *5 | | | | 0.50 | |
| Resin having film-forming property | Acrylic acid ester copolymer | "SG-708-6"*6 | 19.51 | 29.26 | 15.60 | | |
| | Acrylic resin | "UC-3900"*7 | 9.75 | | 7.80 | | |
| | Phenoxy resin | "YL-6954"*8 | | | | 20.00 | |
| Coupling agent | Propyl trimethoxysilan | "KBM303"*9 | 0.52 | 0.52 | 0.42 | | |
| Silica | | "Quotron SP-03B"*10 | | | 20.00 | | |
| Connection reliability | | | A | A | B | A | C |
| Anti-reflowability | | | A | A | A | B | C |
| Productivity | | | A | A | A | A | — |

*1"NC6000" is a solid three functional epoxy resin having a softening point of 60° C. and produced by Nippon Kayaku Co., Ltd.

*2"Epiclon840S" is a liquid bis A type epoxy resin having an epoxy equivalent of 180 and produced by Dainippon ink and chemicals, Incorporated.

*3"PR-53647" is a resin having a softening point of 95° C. and an OH equivalent of 104 and produced by Sumitomo Bakelite Co., Ltd.

*4"2P4MHZ" is 2-phenyl-4-methyl-5- hydroxyimidazole and produced by Shikoku Chemicals Corporation.

*5"Phosphorus compound" is a molecular compound of tetraphenyl phosphine, phenyl trimethoxysilane and 2,3-dihydroxynaphthalene.

*6"SG-708-6" is a 16 mol % butyl acrylate - 46 mol % ethyl acrylate - 34 mol % acrylonitrile - 2.5 mol % acrylic acid - 1.3 mol % hydroxyethyl copolymer having a molecule weight of 500,000.

*7"UC-3900" is produced by Toagosei Co., Ltd.

*8"YL-6954" is produced by Japan Epoxy Resins Co., Ltd.

*9"KBM303" is β- (3,4-epoxycyclohexyl) ethyl trimethoxysilane and produced by Shin-Etsu Chemical Co., Ltd.

*10"Quotron SP-03B" is silica having an average particle size of 0.02 μm and produced by Fuso Chemical Co., Ltd.

As can be seen in Table 2, it was confirmed that each of the semiconductor devices obtained in Examples B1 to B4 had superior connection reliability. This shows that the semiconductor element having electrodes each passing through the semiconductor element in the thickness thereof and the other semiconductor element are appropriately bonded together.

In the method for manufacturing a semiconductor device of each of Examples B1 to B4, it was confirmed that the productivity of the semiconductor device was excellent.

Further, in the method of Comparative Example B1, that is, the method in which the gap between the semiconductor device and the substrate was filled with the liquid sealing resin, it was confirmed that the connection reliability of each semiconductor device was lowered. This is because it is difficult to supply the liquid sealing resin between the electrodes (wirings) whose pitch is narrow as mentioned above, as a result of which the filling factor is lowered.

INDUSTRIAL APPLICABILITY

According to the present invention, a film for use in manufacturing a semiconductor device which can manufacture the semiconductor device in high productivity without cleaning a flux and improve workability in processing a semiconductor wafer can be obtained.

Further, according to the present invention, a method for manufacturing a semiconductor device in which a semiconductor element and a structural body comprising a substrate are bonded together in high productivity can be obtained.

Furthermore, a semiconductor device comprising a cured product of a bonding layer of the film above can be obtained.

Moreover, according to the present invention, a semiconductor device in which a semiconductor element and a structural body comprising a substrate are preferably bonded together can be obtained. Therefore, these provide industrial applicability.

What is claimed is:

1. A film for use in manufacturing a semiconductor device having a substrate and at least one semiconductor element with an observable surface, the film comprising:
a base sheet having one surface; and
a bonding layer provided on the one surface of the base sheet, the bonding layer being adapted to be bonded to the semiconductor element in the semiconductor device, the bonding layer being formed of a resin composition comprising a crosslinkable resin and a compound having flux activity,
wherein the bonding layer has such transparency as to allow a pattern provided on the observable surface of the semiconductor element to be observed through the bonding layer when the bonding layer is bonded to the observable surface to thereby allow performing alignment between the semiconductor element and the substrate.

2. The film as claimed in claim 1, wherein the semiconductor element has electrode terminals provided on the one surface thereof.

3. The film as claimed in claim 1, wherein the semiconductor element is of a flip-chip type and the observable surface is a functional surface, and
wherein the bonding layer is adapted to be bonded to the functional surface of the semiconductor element.

4. The film as claimed in claim 1, wherein in the case where the bonding layer is heated from room temperature at a temperature raising rate of 10° C./min to bring it into a molten state, the bonding layer in the molten state has such a property that a melt viscosity thereof is initially lowered down to a lowest value, and then is raised, and
wherein the lowest value of the melt viscosity is in the range of 10 to 10,000 Pa s.

5. The film as claimed in claim 1, further comprising a releasing layer provided between the base sheet and the bonding layer.

6. The film as claimed in claim 1, wherein the resin composition further comprises a resin having film-forming property.

7. The film as claimed in claim 6, wherein the resin composition further comprises a curing agent.

8. The film as claimed in claim 7, wherein the resin composition further comprises an inorganic filler.

9. The film as claimed in claim 8, wherein an average particle size of particles of the inorganic filler is 0.5 μm or less.

10. The film as claimed in claim 1, wherein the compound having flux activity includes a curing agent having flux activity.

11. The film as claimed in claim 1, wherein the compound having flux activity has at least one functional group selected from the group comprising a carboxyl group and a phenolic hydroxyl group.

12. The film as claimed in claim 1, wherein the film is used for bonding the semiconductor element to a structural body included in the semiconductor device, the structural body comprising the substrate and another semiconductor element provided on the substrate, and
wherein the semiconductor elements are adapted to be bonded together through the bonding layer of the film from which the base sheet has been removed.

13. A semiconductor device comprising a cured product of the bonding layer of the film defined by claim 1.

14. A semiconductor device, comprising:
a substrate having one surface;
a first semiconductor element provided on the one surface of the substrate;
a second semiconductor element provided on the first semiconductor element, the second semiconductor element having a plurality of conductive portions each passing through the second semiconductor element in a thickness direction thereof;
protruding electrodes formed on the first semiconductor element through which the first semiconductor element and the second semiconductor element are electrically connected together; and
a first joint layer provided between the first semiconductor element and the second semiconductor element, the first joint layer being formed of a cured product of the bonding layer of the film defined by claim 1.

15. The semiconductor device as claimed in claim 14, further comprising:
protruding electrodes formed on the one surface of the substrate through which the substrate and the first semiconductor element are electrically connected together, and
a second joint layer provided between the substrate and the first semiconductor element, the second joint layer being formed of a cured product of a resin composition comprising a crosslinkable resin and a compound having flux activity.

16. The semiconductor device as claimed in claim 15, wherein the resin composition of each of the first and second joint layers further comprises a resin having a film-forming property.

17. The semiconductor device as claimed in claim 16, wherein the compound having flux activity has at least one functional group selected from the group comprising a carboxyl group and a phenolic hydroxyl group.

18. The semiconductor device as claimed in claim 17, wherein the compound having flux activity serves as a curing agent for the crosslinkable resin.

19. The film as claimed in claim 1, wherein the base sheet comprises a support base and an adhesive layer provided on the support base.

20. The film as claimed in claim 1, wherein the pattern is provided by at least one of an alignment mark, an electrical connection and a protruding electrode.

21. A film for use in manufacturing a semiconductor device having at least a first semiconductor element and a second semiconductor element, each semiconductor element having an observable surface, the film comprising:
   a base sheet having one surface; and
   a bonding layer provided on the surface of the base sheet, the bonding layer being adapted to be bonded to one of the semiconductor elements in the semiconductor device, the bonding layer being formed of a resin composition comprising a crosslinkable resin and a compound having flux activity,
   wherein the bonding layer has such transparency as to allow a pattern provided on the observable surface of said one of the semiconductor elements to be observed through the bonding layer when the bonding layer is bonded to the observable surface of said one of the semiconductor elements to thereby allow performing alignment between the first semiconductor element and the second semiconductor element.

* * * * *